(12) United States Patent
Yoon et al.

(10) Patent No.: US 10,741,571 B2
(45) Date of Patent: Aug. 11, 2020

(54) VERTICAL MEMORY DEVICES AND METHODS OF MANUFACTURING THE SAME

(71) Applicants: Young-Bae Yoon, Hwaseong-si (KR); Joong-Shik Shin, Yongin-si (KR); Kwang-Ho Kim, Suwon-si (KR); Hyun-Mog Park, Seoul (KR)

(72) Inventors: Young-Bae Yoon, Hwaseong-si (KR); Joong-Shik Shin, Yongin-si (KR); Kwang-Ho Kim, Suwon-si (KR); Hyun-Mog Park, Seoul (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 6 days.

(21) Appl. No.: 15/401,486

(22) Filed: Jan. 9, 2017

(65) Prior Publication Data

US 2017/0294388 A1 Oct. 12, 2017

(30) Foreign Application Priority Data

Apr. 8, 2016 (KR) .................. 10-2016-0043335

(51) Int. Cl.
| | |
|---|---|
| *H01L 27/11565* | (2017.01) |
| *H01L 27/11568* | (2017.01) |
| *H01L 27/11578* | (2017.01) |
| *H01L 27/11582* | (2017.01) |
| *H01L 27/11575* | (2017.01) |

(52) U.S. Cl.
CPC .. *H01L 27/11565* (2013.01); *H01L 27/11568* (2013.01); *H01L 27/11575* (2013.01); *H01L 27/11578* (2013.01); *H01L 27/11582* (2013.01)

(58) Field of Classification Search
CPC ......... H01L 27/11582; H01L 27/11556; H01L 27/1157; H01L 27/11551; H01L 23/528; H01L 23/5226; H01L 27/11565; H01L 23/562; H01L 27/11524; H01L 27/11529

See application file for complete search history.

(56) References Cited

U.S. PATENT DOCUMENTS

| | | | | |
|---|---|---|---|---|
| 2008/0173932 | A1* | 7/2008 | Kidoh | H01L 27/11568 257/324 |
| 2010/0202206 | A1* | 8/2010 | Seol | G11C 16/0408 365/185.17 |
| 2011/0151667 | A1* | 6/2011 | Hwang | H01L 27/11551 438/667 |
| 2011/0233648 | A1* | 9/2011 | Seol | H01L 21/32137 257/324 |

(Continued)

*Primary Examiner* — Thanhha S Pham
(74) *Attorney, Agent, or Firm* — Harness, Dickey & Pierce, P.L.C.

(57) ABSTRACT

A vertical memory device includes a channel, gate lines, and a cutting pattern, respectively, on a substrate. The channel extends in a first direction substantially perpendicular to an upper surface of the substrate. The gate lines are spaced apart from each other in the first direction. Each of the gate lines surrounds the channel and extends in a second direction substantially parallel to the upper surface of the substrate. The cutting pattern includes a first cutting portion extending in the first direction and cutting the gate lines, and a second cutting portion crossing the first cutting portion and merged with the first cutting portion.

17 Claims, 30 Drawing Sheets

(56) References Cited

U.S. PATENT DOCUMENTS

| | | | |
|---|---|---|---|
| 2011/0291172 A1* | 12/2011 | Hwang | H01L 27/11578 257/314 |
| 2011/0316072 A1 | 12/2011 | Lee | |
| 2012/0098050 A1* | 4/2012 | Shim | H01L 27/11578 257/324 |
| 2012/0119283 A1* | 5/2012 | Lee | H01L 27/11519 257/316 |
| 2012/0119287 A1* | 5/2012 | Park | H01L 27/11519 257/329 |
| 2012/0135583 A1* | 5/2012 | Jang | H01L 27/11582 438/433 |
| 2012/0170369 A1* | 7/2012 | Kim | H01L 29/792 365/185.05 |
| 2012/0195125 A1* | 8/2012 | Choe | G11C 16/0483 365/185.15 |
| 2012/0224426 A1* | 9/2012 | Nam | G11C 16/0483 365/185.11 |
| 2012/0273872 A1* | 11/2012 | Lim | H01L 27/0688 257/329 |
| 2013/0126957 A1* | 5/2013 | Higashitani | H01L 27/11519 257/314 |
| 2014/0110795 A1* | 4/2014 | Oh | H01L 27/11573 257/401 |
| 2014/0145255 A1* | 5/2014 | Seol | G11C 16/0408 257/321 |
| 2014/0199815 A1* | 7/2014 | Hwang | H01L 29/66833 438/270 |
| 2014/0291848 A1* | 10/2014 | Lee | H01L 23/53238 257/751 |
| 2015/0008499 A1* | 1/2015 | Lee | H01L 27/11273 257/314 |
| 2015/0137216 A1* | 5/2015 | Lee | H01L 27/11582 257/329 |
| 2015/0303214 A1* | 10/2015 | Kim | H01L 27/11582 257/329 |
| 2015/0325588 A1* | 11/2015 | Lee | H01L 27/11573 257/329 |
| 2015/0340376 A1* | 11/2015 | Park | H01L 27/11582 257/329 |
| 2016/0351672 A1* | 12/2016 | Eom | H01L 27/11565 |
| 2017/0018566 A1 | 1/2017 | Sonehara | |

* cited by examiner

FIG. 2
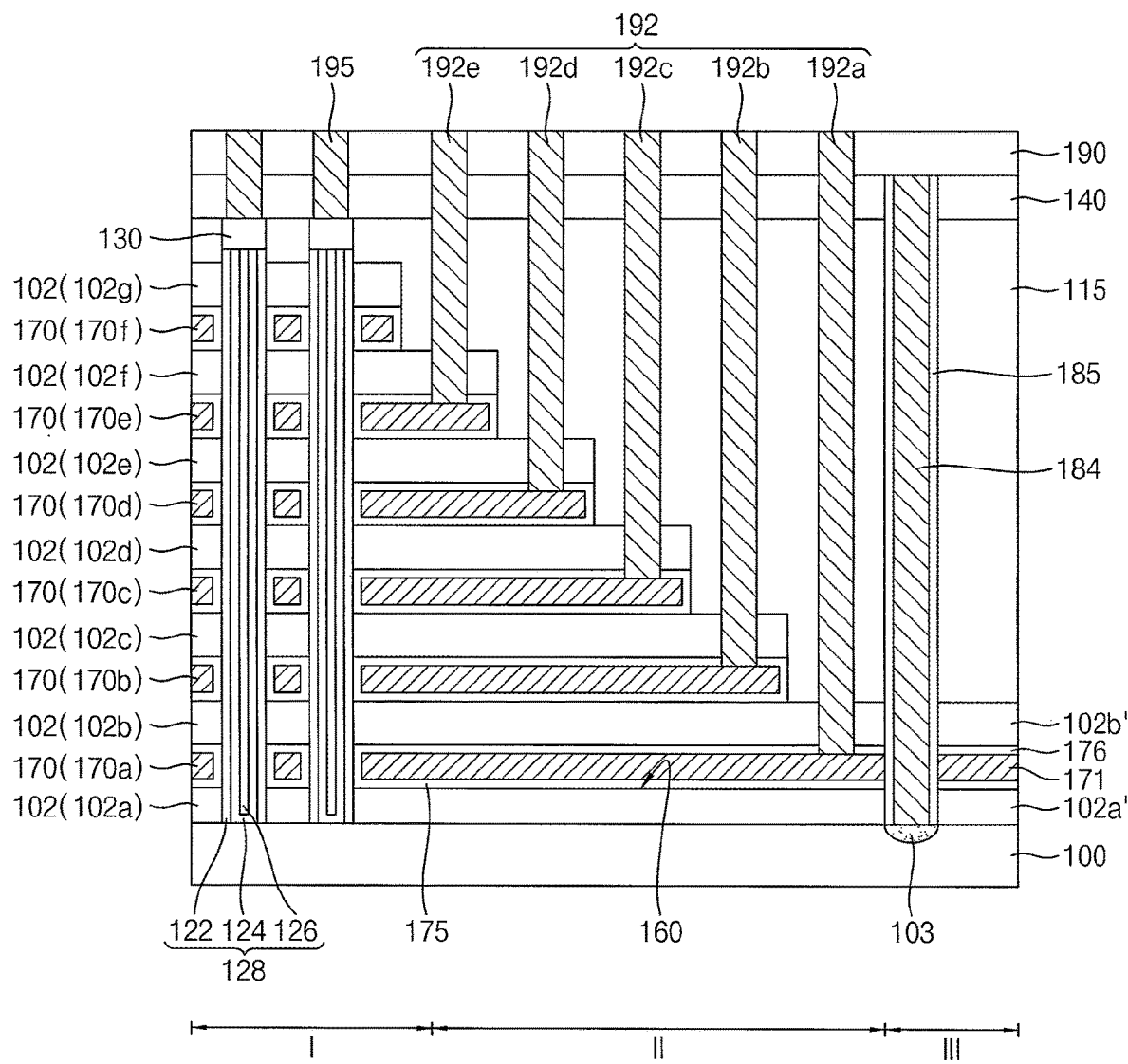
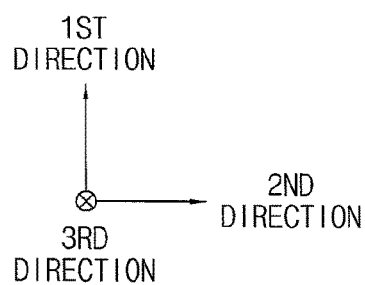

FIG. 3
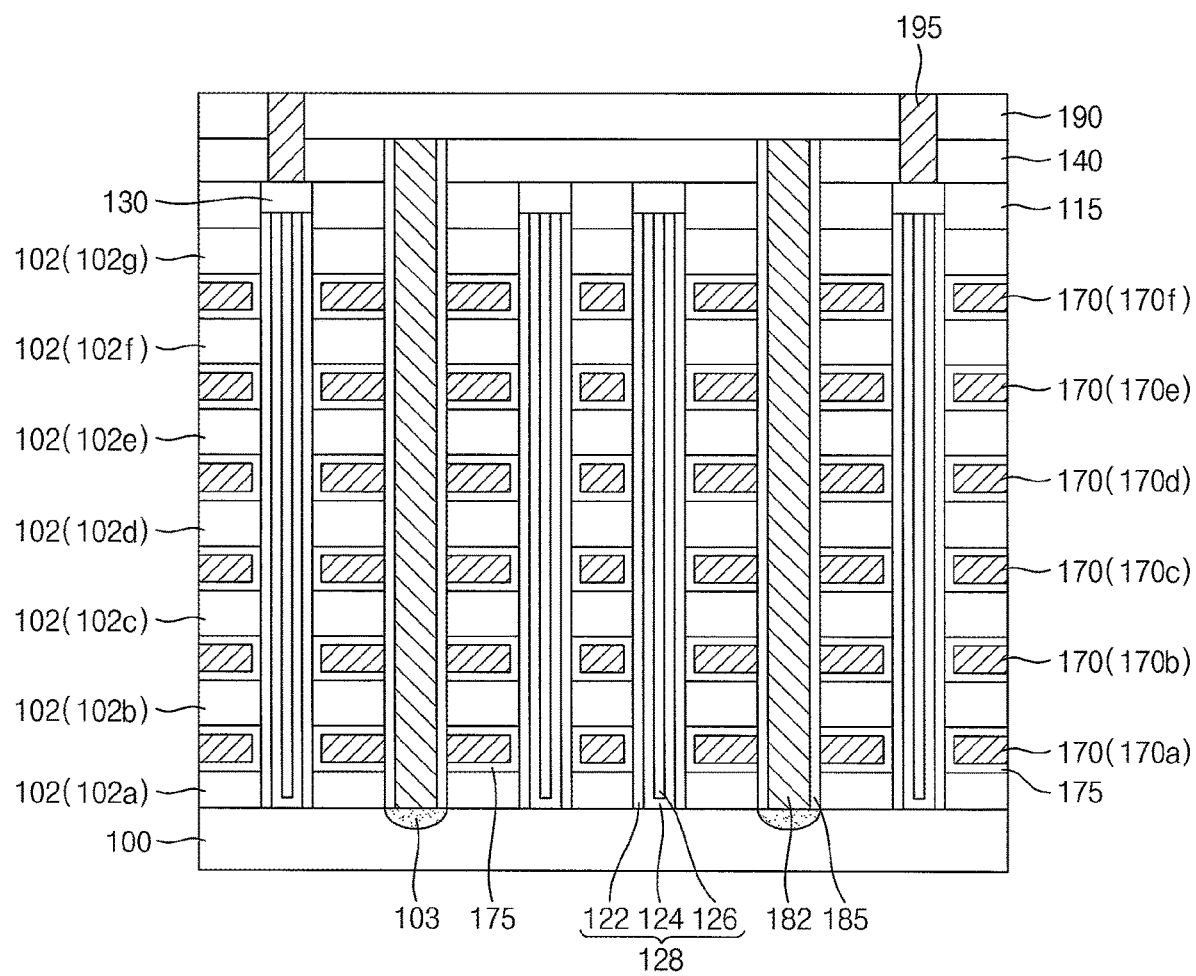
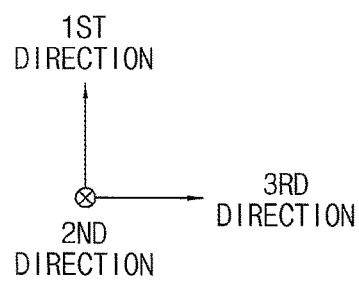

FIG. 5
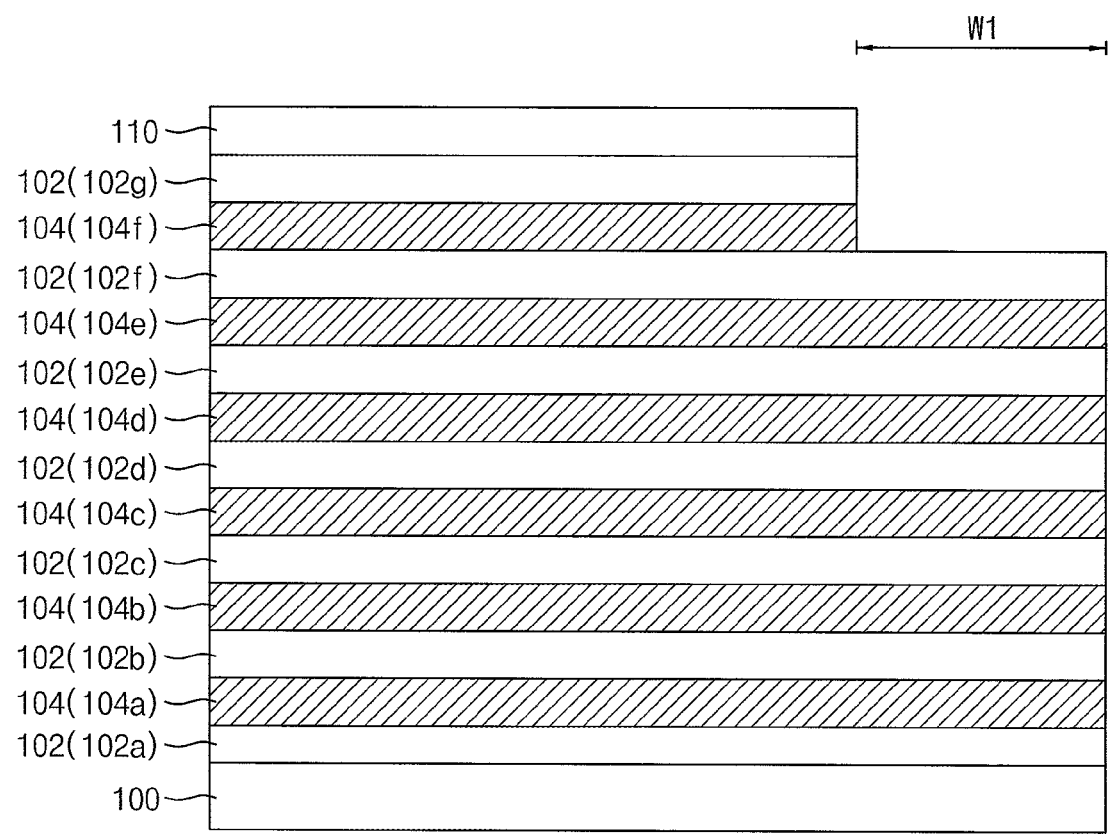
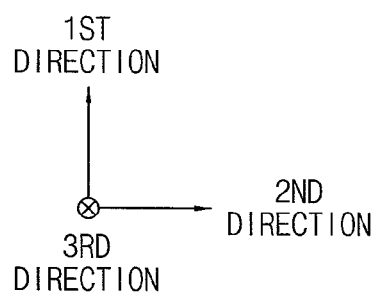

FIG. 7
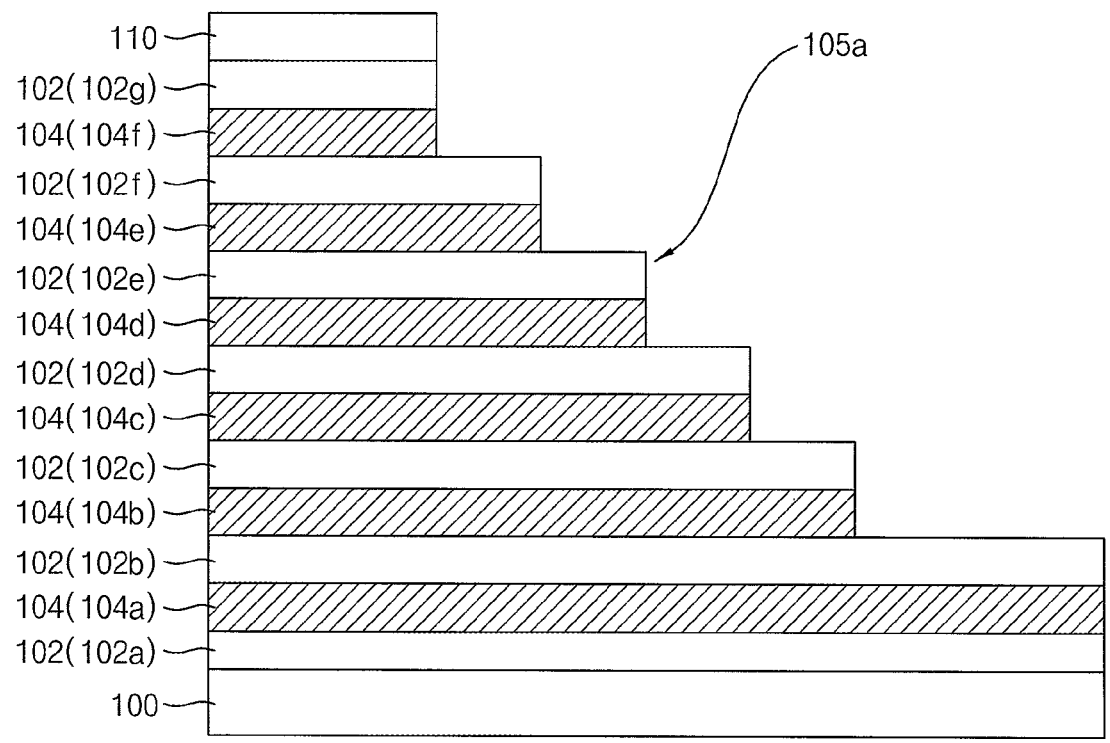
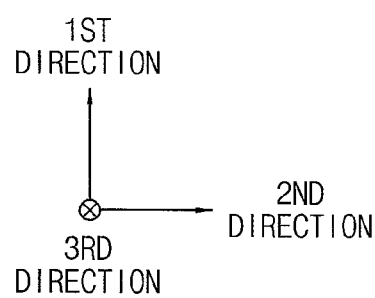

FIG. 8
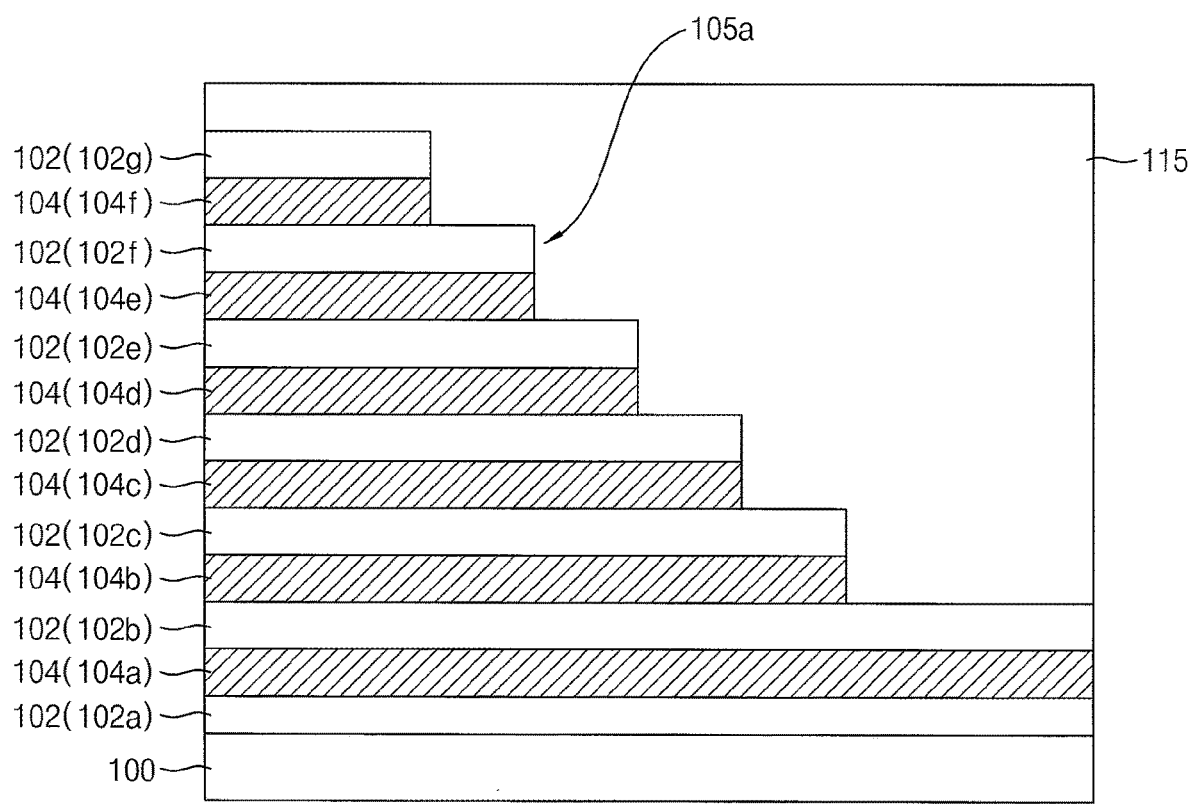
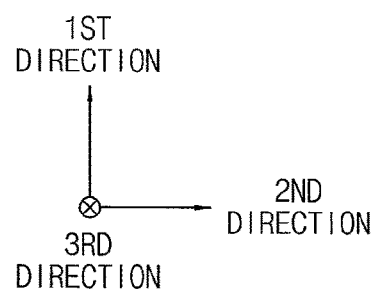

FIG. 10
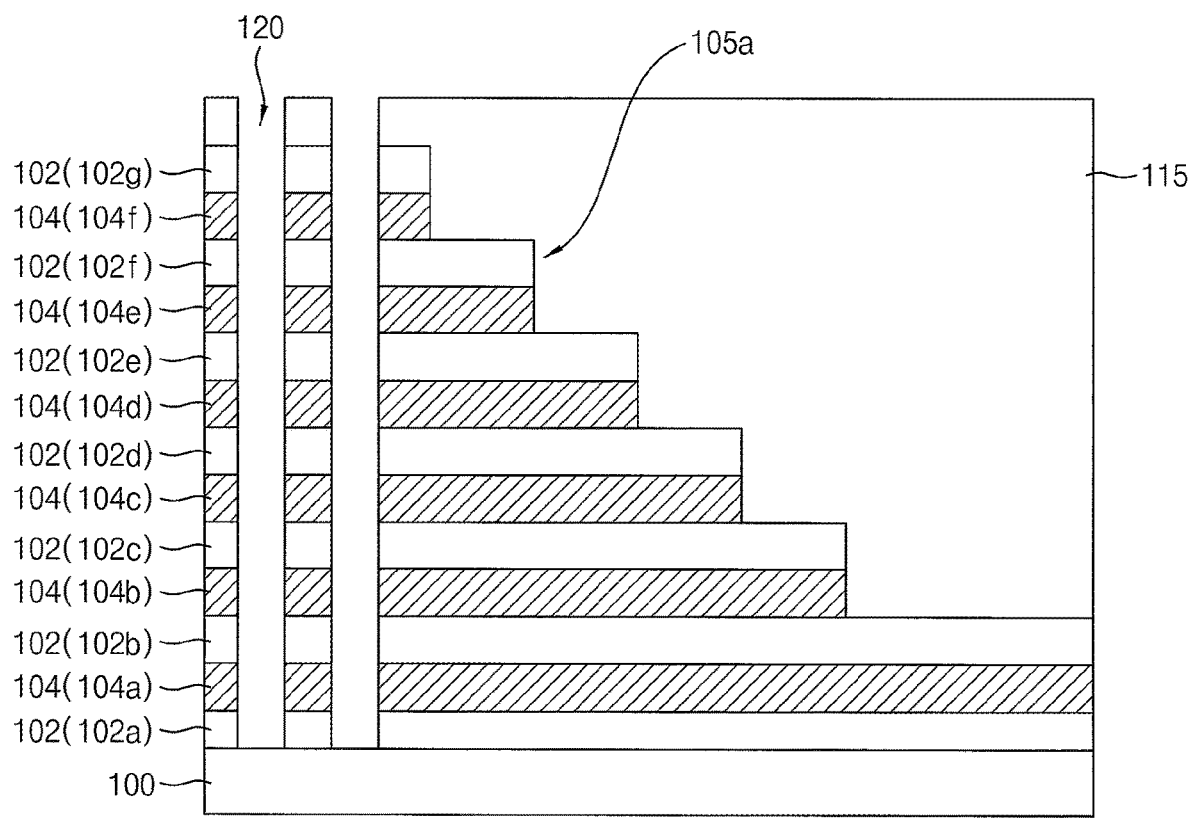
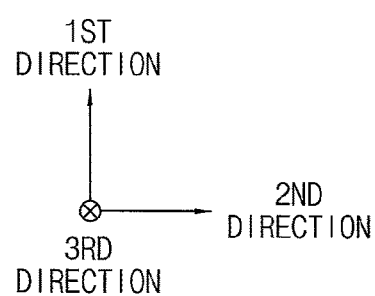

FIG. 18
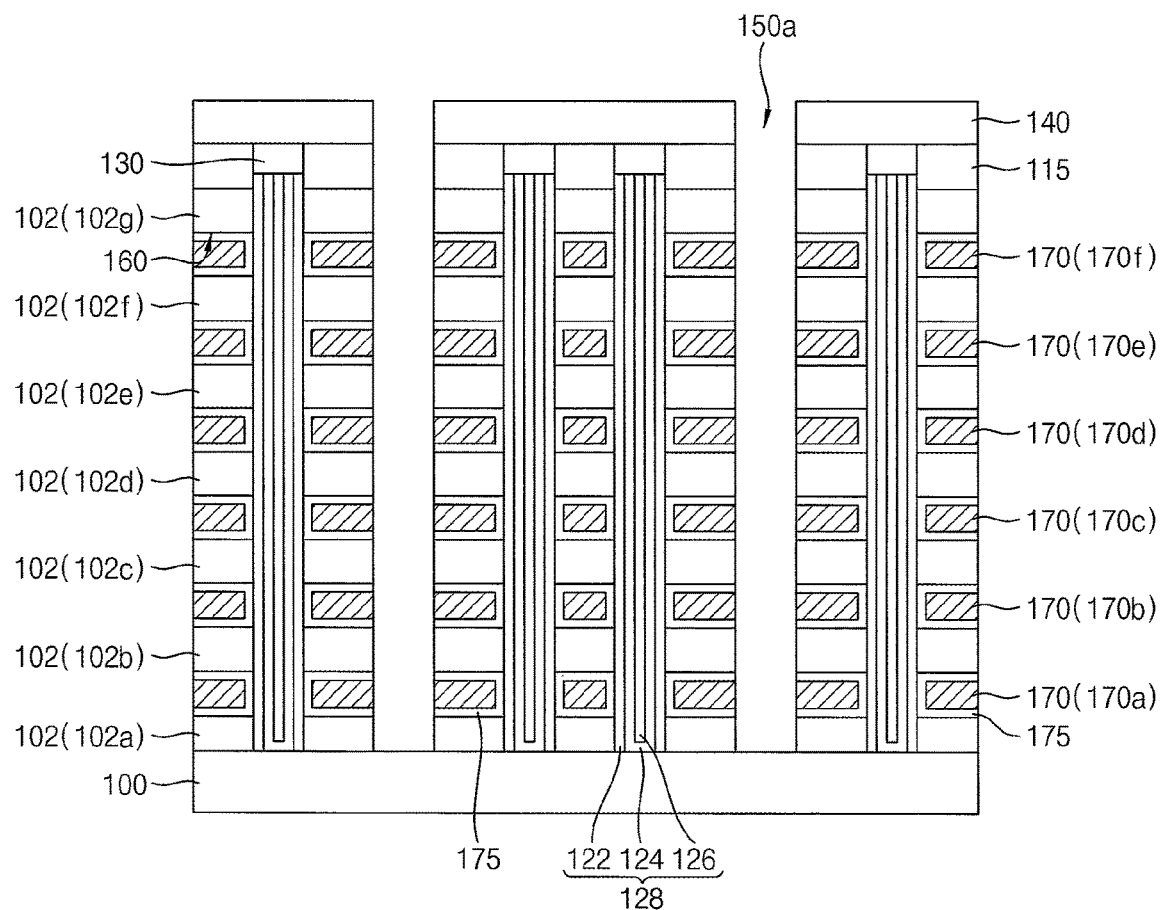
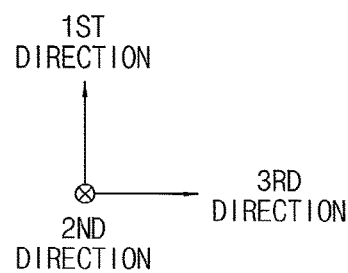

FIG. 21
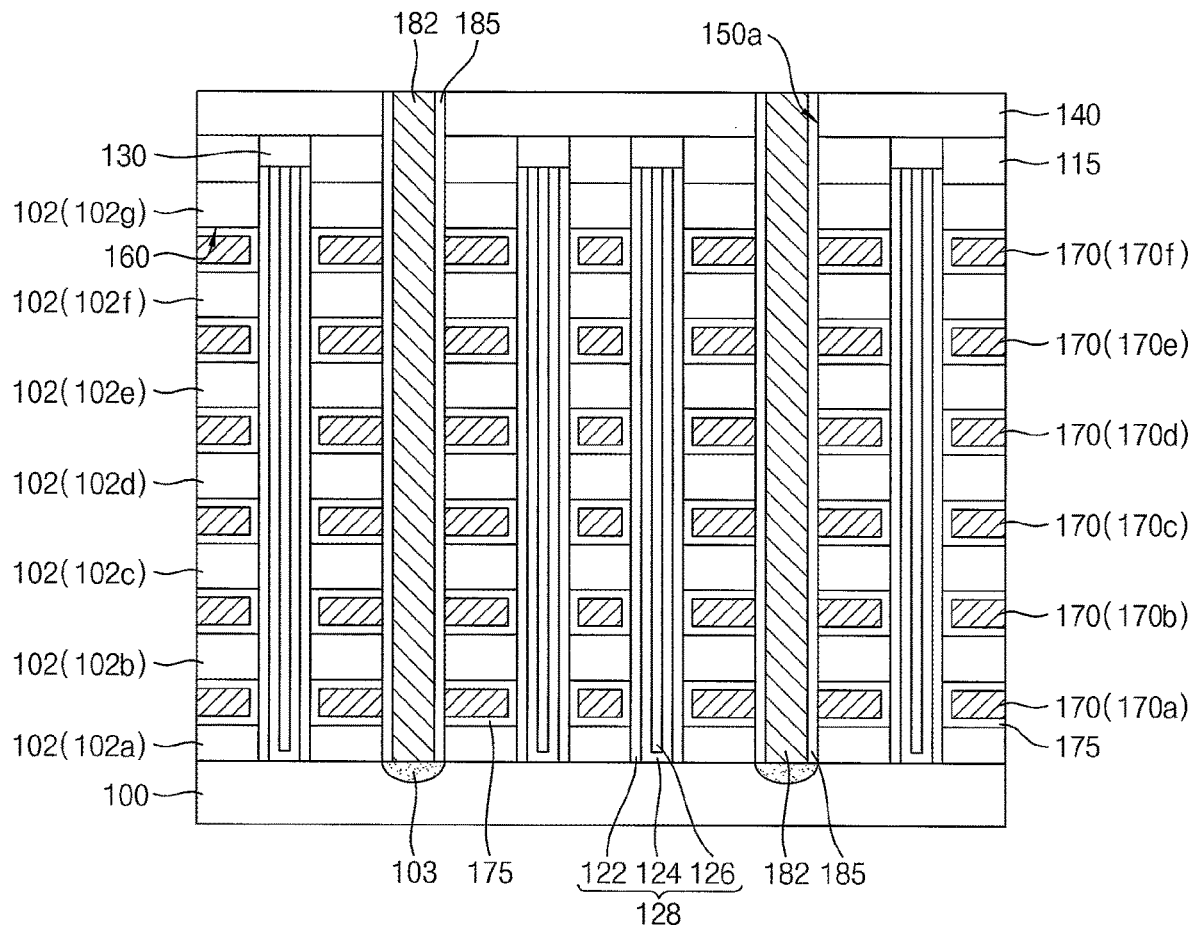
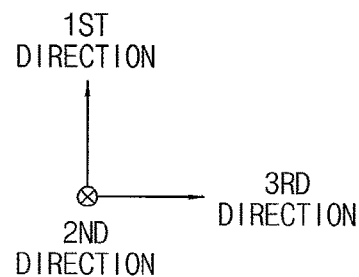

FIG. 23
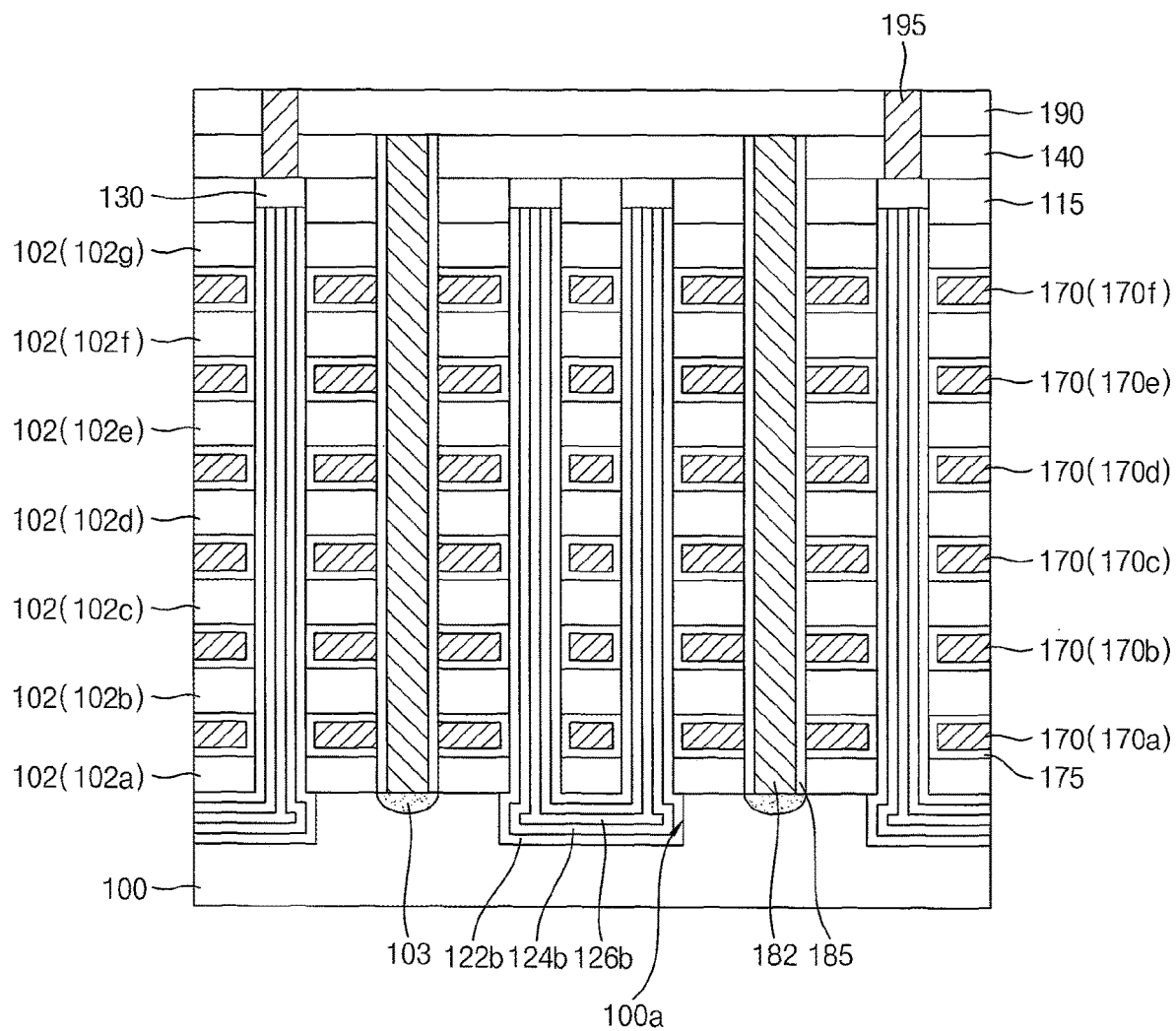
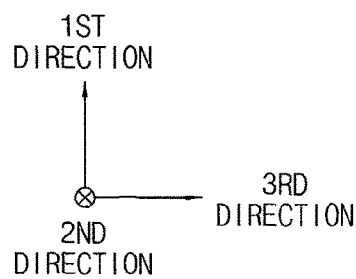

VERTICAL MEMORY DEVICES AND METHODS OF MANUFACTURING THE SAME

CROSS-REFERENCE TO RELATED APPLICATION

This application claims priority under 35 USC § 119 to Korean Patent Application No. 10-2016-0043335 filed on Apr. 8, 2016 in the Korean Intellectual Property Office (KIPO), the contents of which are incorporated by reference herein in their entirety.

BACKGROUND

1. Field

Example embodiments relate to vertical memory devices and methods of manufacturing the same. More particularly, example embodiments relate to vertical memory devices including vertically extending channels and methods of manufacturing the same.

2. Description of Related Art

Recently, a vertical memory device including a plurality of memory cells stacked vertically with respect to a surface of a substrate has been developed in order to achieve a high degree of integration. In the vertical memory device, a channel having a pillar shape or a cylindrical shape may protrude vertically from the surface of the substrate, and gate lines surrounding the channel may be repeatedly stacked in a staircase shape.

As the degree of integration of the vertical memory device becomes greater, the number of the gate lines, and the number of steps of the staircase shape may increase. Thus, the complexity of the process for forming the steps may increase.

SUMMARY

Example embodiments provide a vertical memory device having enhanced structural and electrical reliability.

Example embodiments provide a method of manufacturing a vertical memory device having enhanced structural and electrical reliability.

According to example embodiments, a vertical memory device may include a substrate, a channel, gate lines, and a cutting pattern. The channel is on the substrate and extends in a first direction substantially perpendicular to an upper surface of the substrate. The gate lines are on the substrate and are spaced apart from each other in the first direction. Each of the gate lines may surround the channel and extends in a second direction substantially parallel to the upper surface of the substrate. The cutting pattern may include a first cutting portion extending in the first direction and cutting the gate lines, and a second cutting portion crossing the first cutting portion and merged with the first cutting portion.

According to example embodiments, a vertical memory device may include a substrate, a plurality of gate line stack structures spaced apart from each other on the substrate, and a common source line (CSL). in a third direction on the substrate, and a common source line (CSL). Each of the gate line stack structures may include a channel extending in a first direction substantially perpendicular to an upper surface of the substrate, and gate lines spaced apart from each other in the first direction. Each of the gate lines may surround the channel and extend in a second direction substantially parallel to the upper surface of the substrate and crossing a third direction. The third direction is substantially parallel to the upper surface of the substrate. The gate line stack structures may be spaced apart from each other in the third direction. The CSL may surround sidewalls of the gate line stack structures along the second and third directions.

According to example embodiments, a vertical memory device may include

According to an example embodiment, a vertical memory device includes a substrate, a plurality of gate lines stacked on top of each other on the substrate, a plurality of vertical channels on the substrate, and a common source line (CSL) on the substrate. The gate lines include end portions that extend different lengths parallel to the upper surface of the substrate to define a staircase shape. The plurality of vertical channels are spaced apart from each other and extend through the plurality of gate lines. The CSL includes first portions that cross into a second portion of the CSL on the substrate, extend through the plurality of gate lines, and are spaced apart from each other. The second portion of the CSL extends through a lowermost one of the plurality of gate lines and is spaced apart from the end portions of the plurality of gate lines.

In the vertical memory device in accordance with example embodiments, after forming the stepped mold structure, the step portions for the GSL may be simultaneously formed with the opening for the gate line cutting. Thus, the photo mask for forming the stepped mold structure may be reduced. In the opening, the cutting pattern may be formed, and the cutting pattern may include first cutting portions dividing the gate line stack structure, and a second cutting portion crossing the first cutting portions and connecting the first cutting portions to each other. According to the operation design through the gate line stack structure, the first and second cutting portions may be designed.

BRIEF DESCRIPTION OF THE DRAWINGS

Example embodiments will be more clearly understood from the following detailed description taken in conjunction with the accompanying drawings. FIGS. 1 to 30 represent non-limiting, example embodiments as described herein.

FIGS. 1 to 3 are a plan view and cross-sectional views illustrating a vertical memory device in accordance with example embodiments;

FIGS. 4 to 21 are cross-sectional views and plan views illustrating a method of manufacturing a vertical memory device in accordance with example embodiments;

FIG. 22 is a cross-sectional view illustrating a vertical memory device in accordance with example embodiments;

FIG. 23 is a cross-sectional view illustrating a vertical memory device in accordance with example embodiments;

FIG. 24 is a plan view illustrating a vertical memory device in accordance with example embodiments;

FIGS. 25 and 26 are a plan view and a cross-sectional view illustrating a vertical memory device in accordance with example embodiments;

FIGS. 27 and 28 are plan views illustrating a vertical memory device in accordance with example embodiments;

FIG. 29 is a plan view illustrating a vertical memory device in accordance with example embodiments; and FIG. 30 is a plan view illustrating a vertical memory device in accordance with example embodiments.

DESCRIPTION OF EXAMPLE EMBODIMENTS

A direction substantially vertical to an upper surface of a substrate is referred to as a first direction, and two directions substantially parallel to the upper surface of the substrate and crossing each other are referred to as second and third directions, respectively. For example, the second direction and the third direction are substantially perpendicular to each other. Additionally, a direction indicated by an arrow and a reverse direction thereof are considered as the same direction. The above mentioned definitions of the directions are the same throughout all the figures in this specification.

Figure 1:
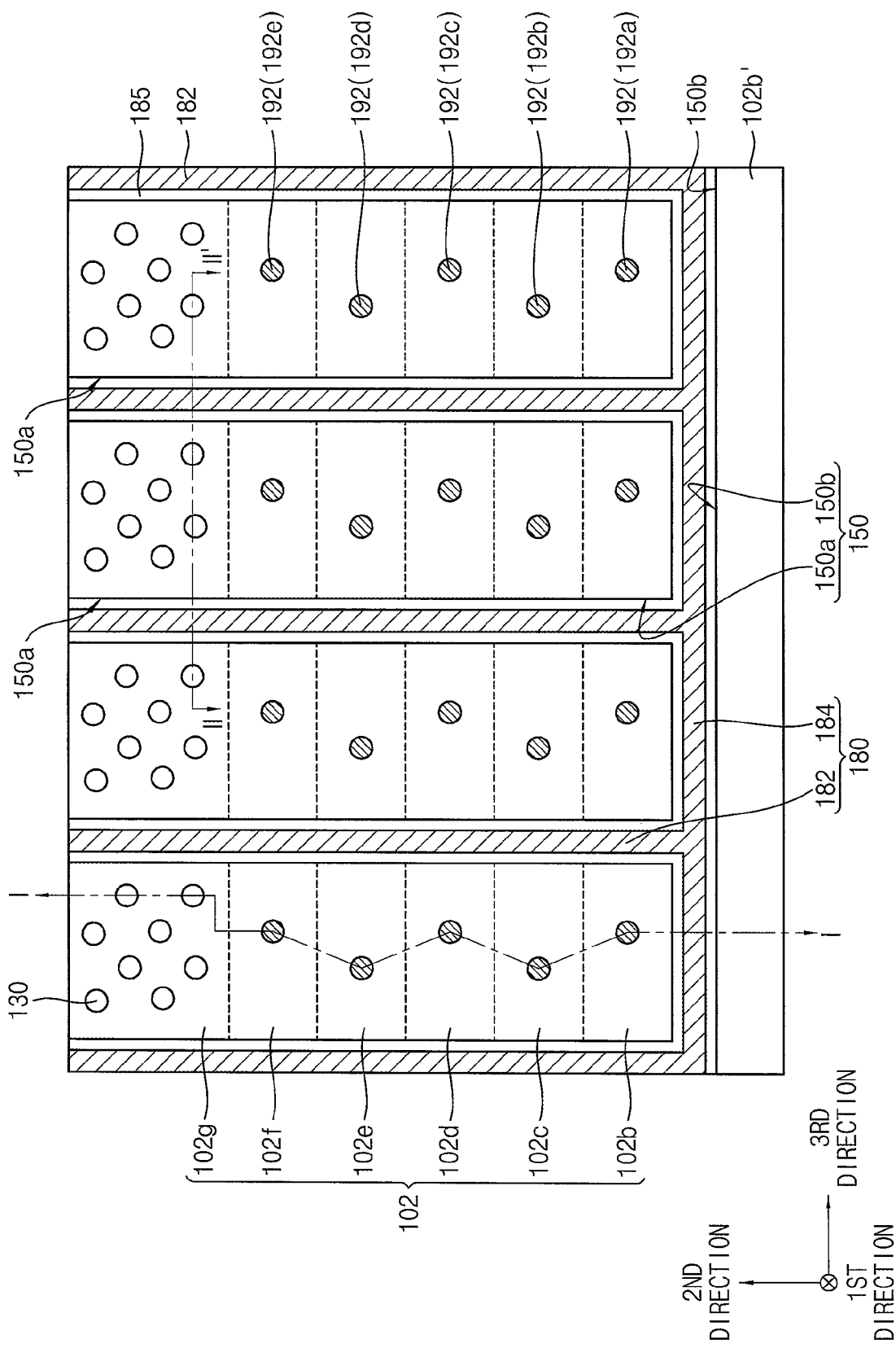

FIGS. 1 to 3 are a plan view and cross-sectional views illustrating a vertical memory device in accordance with example embodiments. Particularly, FIG. 1 is a plan view, and FIGS. 2 and 3 are cross-sectional views taken along lines I-I' and II-II', respectively, of FIG. 1.

For the convenience of explanations, some elements, e.g., a first upper insulation layer 140, a second upper insulation layer 190, a plug 195, etc. are omitted in FIG. 1.

Referring to FIGS. 1 to 3, the vertical memory device may include a vertical channel structure 128 extending from an upper surface of a substrate 100 in the first direction, gate lines 170 and insulating interlayers 102, which may surround the vertical channel structure 128 and are alternately stacked in the first direction in a staircase shape, a cutting pattern 180 cutting the gate lines 170 and the insulating interlayers 102, and contacts 192 electrically connected to the gate lines 170 in the respective levels.

The substrate 100 may include a semiconductor material, e.g., silicon, germanium, etc. In some example embodiments, the substrate 100 may include single crystalline silicon. For example, the substrate 100 may serve as a body for the vertical memory device. In some example embodiments, a p-type well may be formed in the substrate 100.

The vertical memory device may have first, second and third regions I, II and III. Thus, the substrate 100 may be also divided into the first, second and third regions I, II and III (refer to FIG. 2).

The first region I may serve as a cell region where the vertical channel structure 128 may be formed. For example, the vertical channel structure 128 and the gate lines 170 surrounding the vertical channel structure 128 may define a cell string. The second region II may serve as an extension region wherein step portions of the gate lines 170 and the contacts 192 are formed. The third region III may serve as a dummy region.

In some example embodiments, a pair of second regions II may be symmetrically formed at opposite sides, respectively, of the first region I in the second direction.

The vertical channel structure 128 may extend through the gate lines 170 and the insulating interlayers 102 in the first direction. As shown in FIG. 2, the vertical channel structure 128 may directly contact the upper surface of the substrate 100.

The vertical channel structure 128 may include a channel 124, a dielectric layer structure 122 and a filling pattern 126.

The channel 124 may have a cup-like shape. The channel 124 may contact the upper surface of the substrate 100. The filling pattern 126 may have a pillar shape in an inner space formed by the channel 124 having the cup-like shape. Alternatively, the channel 124 may have a pillar shape, and in this case, the filling pattern 126 may not be formed.

The channel 124 may include a semiconductor such as polysilicon or single crystalline silicon, and may include, e.g., p-type impurities such as boron (B) in a portion thereof. The filling pattern 126 may include an insulation material, e.g., silicon oxide.

The dielectric layer structure 122 may have a hollow cylindrical shape, which may cover an outer sidewall of the channel 124. The dielectric layer structure 122 may include a tunnel insulation layer, a charge storage layer and a blocking layer sequentially stacked from the outer sidewall of the channel 124.

The tunnel insulation layer may include an oxide, e.g., silicon oxide. The charge storage layer may include a nitride, e.g., silicon nitride or a metal oxide. The blocking layer may include silicon oxide or a metal oxide, e.g., hafnium oxide or aluminum oxide. For example, the dielectric layer structure 122 may have an oxide-nitride-oxide (ONO) layered structure.

A capping pad 130 may be formed on the vertical channel structure 128. In example embodiments, the capping pad 130 may be electrically connected to a bit line of the vertical memory device, and may serve as a source/drain pattern for moving electrons into the channel 124. The capping pad 130 may include a semiconductor (e.g., polysilicon or single crystalline silicon), and may further include n-type impurities, e.g., phosphorus, arsenic, etc.

As illustrated in FIG. 1, a plurality of capping pads 130 may be arranged along the second direction in the first region I such that a capping pad row may be defined, and a plurality of capping pad rows may be arranged in the third direction. The vertical channel structures 128 may be also arranged according to the arrangement of the capping pads 130. For example, a plurality of vertical channel structures 128 may be arranged along the second direction in the first region I to form a channel row, and a plurality of channel rows may be arranged in the third direction.

The capping pads 130 in neighboring ones of the capping pad rows or the vertical channel structures 128 in neighboring ones of the channel rows may be arranged in a zigzag pattern along the second direction and/or the third direction. Thus, more vertical channel structures 128 may be formed in a unit area of the substrate 100.

The gate lines 170 (for example, 170*a*~170*f* may cover an outer sidewall of the vertical channel structure 128, and may be spaced apart from each other along the first direction. In example embodiments, each gate line 170 may partially surround the channels 124 or the vertical channel structures 128 included in at least one of the channel rows and may extend in the second direction.

In some embodiments, each gate line 170 may surround a given number of channel rows, e.g., 4 channel rows. In this case, a gate line stack structure may be defined by the 4 channel rows and the gate lines 170 surrounding the 4 channel rows. A plurality of gate line stack structures may be arranged along the third direction. However, the number of the channel rows included in the gate line stack structure may be varied according to the circuit design of the vertical memory device.

In example embodiments, widths or lengths of the gate lines 170 may decrease along the first direction from the upper surface of the substrate 100. For example, as illustrated in FIG. 2, a plurality of gate lines 170 may be stacked in a pyramidal shape or a staircase shape, and the lengths of the gate lines 170 in the second direction may gradually decrease.

Each of the gate lines 170 may include a step portion protruding in the second direction from an overlying one of the gate lines 170. The step portion of each of the gate lines 170 may serve as a contact pad for being connected to the contact 192. The step portions may be disposed in the second region II.

The gate lines 170 may include a ground selection line (GSL), a word line and a string selection line (SSL). For example, a lowermost gate line 170*a* may serve as the GSL.

An uppermost gate line 170f may serve as the SSL. The gate lines 170b to 170e between the GSL and the SSL may serve as the word lines.

FIGS. 1 to 3 show that the gate lines 170 are disposed at 6 levels, however, the gate lines 170 may be formed at more levels in consideration of a circuit design and a degree of integration of the vertical memory device, e.g., 16 levels, 24 levels, 32 levels, 48 levels, etc. The SSLs may be formed at two or more levels.

The gate line 170 may include a metal, e.g., tungsten (W), a metal nitride and/or a metal silicide. In some embodiments, the gate line 170 may have a multi-layered structure including a metal nitride, e.g., tungsten nitride, and a metal, e.g., tungsten.

The gate line stack structure may further include the insulating interlayers 102, e.g., 102a to 102g. The insulating interlayers 102 may be disposed between neighboring ones of the gate lines 170 in the first direction. The insulating interlayers 102 may be stacked along the first direction in a pyramidal shape or a staircase shape substantially the same as or similar to that of the gate lines 170.

Accordingly, each of the insulating interlayers 102 may also include a step portion corresponding to that of each of the gate lines 170. In example embodiments, as shown in FIG. 2, the step portions of the gate lines 170 may be covered by those of the insulating interlayers 102.

In example embodiments, the gate line 170 may be covered by an interface layer 175. The interface layer 175 may be formed between the dielectric layer structure 122 and the gate line 170, and between the insulating interlayer 102 and the gate line 170.

The interface layer 175 may be inserted to control the workfunction between the gate line 170 and the channel 124. The interface layer 175 may include, e.g., a metal oxide and/or a metal nitride. The metal oxide may include, e.g., aluminum oxide, and the metal nitride may include titanium nitride, tantalum nitride and/or tungsten nitride.

A mold protection layer 115 may at least partially cover the gate line stack structure. In example embodiments, the mold protection layer 115 may cover the step portions of the gate line stack structure, and may also cover an uppermost insulating interlayer 102g. For example, the capping pad 130 may be formed in the mold protection layer 115.

The first upper insulation layer 140 may be formed on the mold protection layer 115. The first upper insulation layer 140 may cover the capping pads 130. For example, the first upper insulation layer 140 and the mold protection layer 115 may include silicon oxide.

An opening 150 may be formed through the first upper insulation layer 140 and the mold protection layer 115, and may cut the gate lines 170 and the insulating interlayers 102. The cutting pattern 180 may be formed in the opening 150.

In example embodiments, the opening 150 may include a first opening portion 150a and a second opening portion 150b, and the cutting pattern 180 may include a first cutting portion 182 in the first opening portion 150a and a second cutting portion 184 in the second opening portion 150b.

The first opening portion 150a may extend in the second direction through the gate lines 170 and the insulating interlayers 102. A plurality of first opening portions 150a may be formed in the third direction. Thus, the first cutting portion 182 may extend in the second direction, and a plurality of first cutting portions 182 may be formed between neighboring ones of the gate line stack structures.

The second opening portion 150b may extend in the third direction, and may be connected to end portions of the plurality of first opening portions 150a, respectively. Thus, the second cutting portion 184 may extend in the third direction, and may be connected to end portions of the plurality of first cutting portions 182, respectively. The plurality of first cutting portions 182 may be connected by the second cutting portion 184, and the first and second cutting portions 182 and 184 may serve as a single structure.

In example embodiments, the lowermost gate line 170a may be defined by the second cutting portion 184. For example, the second cutting portion 184 may extend in the third direction, and may restrict the lowermost gate lines 170a included in different gate line stack structures. For example, the step portion of the GSL of the vertical memory device may be defined by the second cutting portion 184.

In some example embodiments, the second cutting portion 184 may be disposed at a boundary between the second and third regions II and III. For example, the extension region and the dummy region may be divided by the second cutting portion 184.

As shown in FIG. 2, a dummy gate line 171, a dummy interface layer 176 and a dummy insulating interlayers 102a' and 102b' may be defined in the third region III by the second cutting portion 184.

In example embodiments, the cutting pattern 180 may serve as a common source line CSL of the vertical memory device. The cutting pattern 180 may include a metal, e.g., tungsten, copper, aluminum, etc., a metal silicide, a metal nitride and/or doped polysilicon.

A spacer 185 may be formed on a sidewall of the opening 150. The cutting pattern 180 may be insulated from the gate lines 170 by the spacer 185. The spacer 185 may include an insulation material, e.g., silicon oxide.

An upper surface of the substrate 100 may be exposed by the opening 150, and an impurity region 103 may be formed at an upper portion of the substrate 100 exposed by the opening 150. The cutting pattern 180 may directly contact the impurity region 103. In some example embodiments, a metal silicide layer including, e.g., nickel silicide, cobalt silicide, etc. may be further formed between the cutting pattern 180 and the impurity region 103.

The second upper insulation layer 190 may be formed on the first upper insulation layer 140. The second upper insulation layer 190 may cover the cutting pattern 180 and the spacer 185. For example, the second upper insulation layer 190 may include, e.g., silicon oxide that may be substantially the same as that of the first upper insulation layer 140.

The contacts 192 (e.g., 192a~192e) may extend through the second upper insulation layer 190, the first upper insulation layer 140, the mold protection layer 115 and the insulating interlayer 102 in the second region II, and may contact or be electrically connected to the gate lines 170. In some example embodiments, the contact 192 may extend through the interface layer 175 to contact an upper surface of the gate line 170.

The contacts 192a~192e may be electrically connected to step portions of the GSL 170a and the word lines 170b~170e, respectively. In some example embodiments, a contact electrically connected to the SSL 170f may be formed in a portion of the second region II opposite to a portion of the second region II shown in FIG. 2 with respect to the first region I.

In some example embodiments, the contacts 192 may be arranged in a zigzag layout along the second direction in a plan view as shown in FIG. 1. Thus, distances between neighboring ones of the contacts 192 may increase so that a process margin for forming the contacts 192 may be secured.

The plugs 195 may be formed in the first region I. The plug 195 may extend through the first and second upper insulation layers 140 and 190, and may contact an upper surface of the capping pad 130. For example, the plug 195 may serve as a bit line.

The contact 192 and the plug 195 may include a metal, e.g., tungsten, copper, aluminum, etc., a metal silicide, a metal nitride and/or doped polysilicon.

Bit lines (not shown) and wirings (not shown) electrically connected to the plugs 195 and the contacts 192 may be formed on the second upper insulation layer 190.

In example embodiments, the cutting pattern 180 serving as a CSL may include first and second cutting portions 182 and 184. The second cutting portion 184 may be commonly provided for the gate line stack structures to define the GSL. An area of the CSL may be increased by the second cutting portion 184. Thus, the resistance by the CSL may increase, and the area for the contacts or wirings electrically connected to the CSL may be increased.

In some example embodiments, sidewalls of the gate line stack structure may be completely covered by the first and second cutting portions 182 and 184.

The second cutting portion 184 may serve as a fence between the extension region and the dummy region. For example, the second cutting portion 184 may serve as a structure for blocking stress from the extension region and/or the cell region.

FIGS. 4 to 21 are cross-sectional views and plan views illustrating a method of manufacturing a vertical memory device in accordance with example embodiments. For example, FIGS. 4 to 21 illustrate a method of manufacturing the vertical memory device illustrated in FIGS. 1 to 3.

Figure 9:
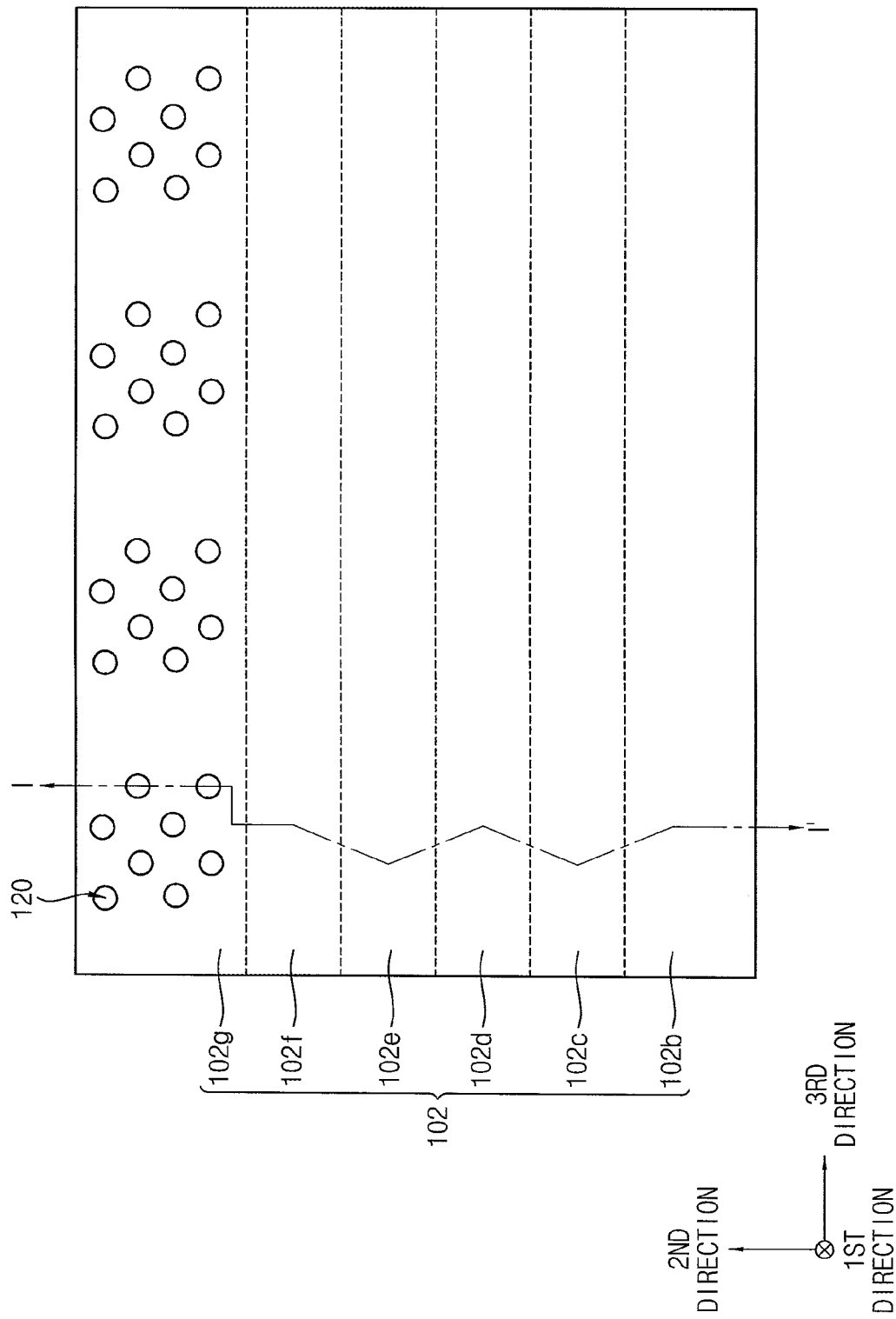
Figure 11:
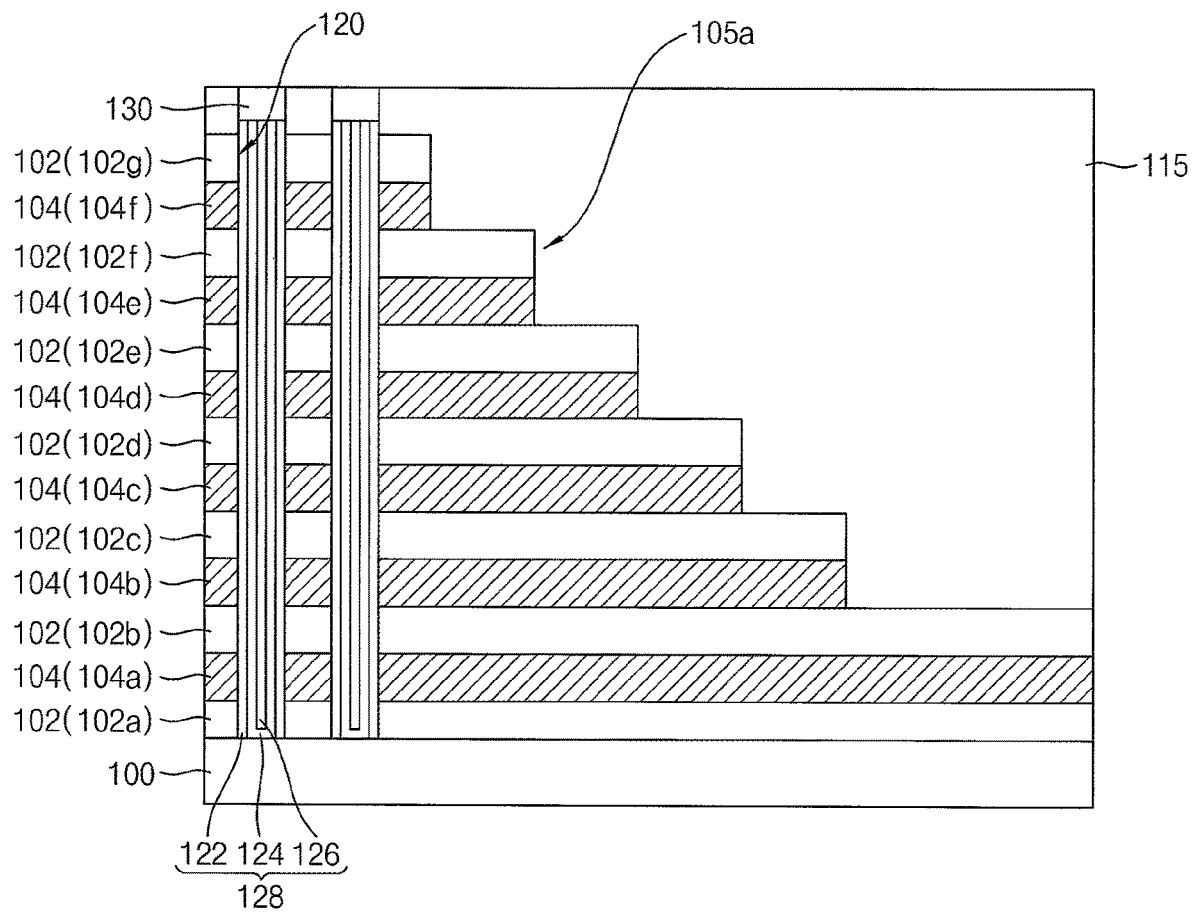
Figure 12:
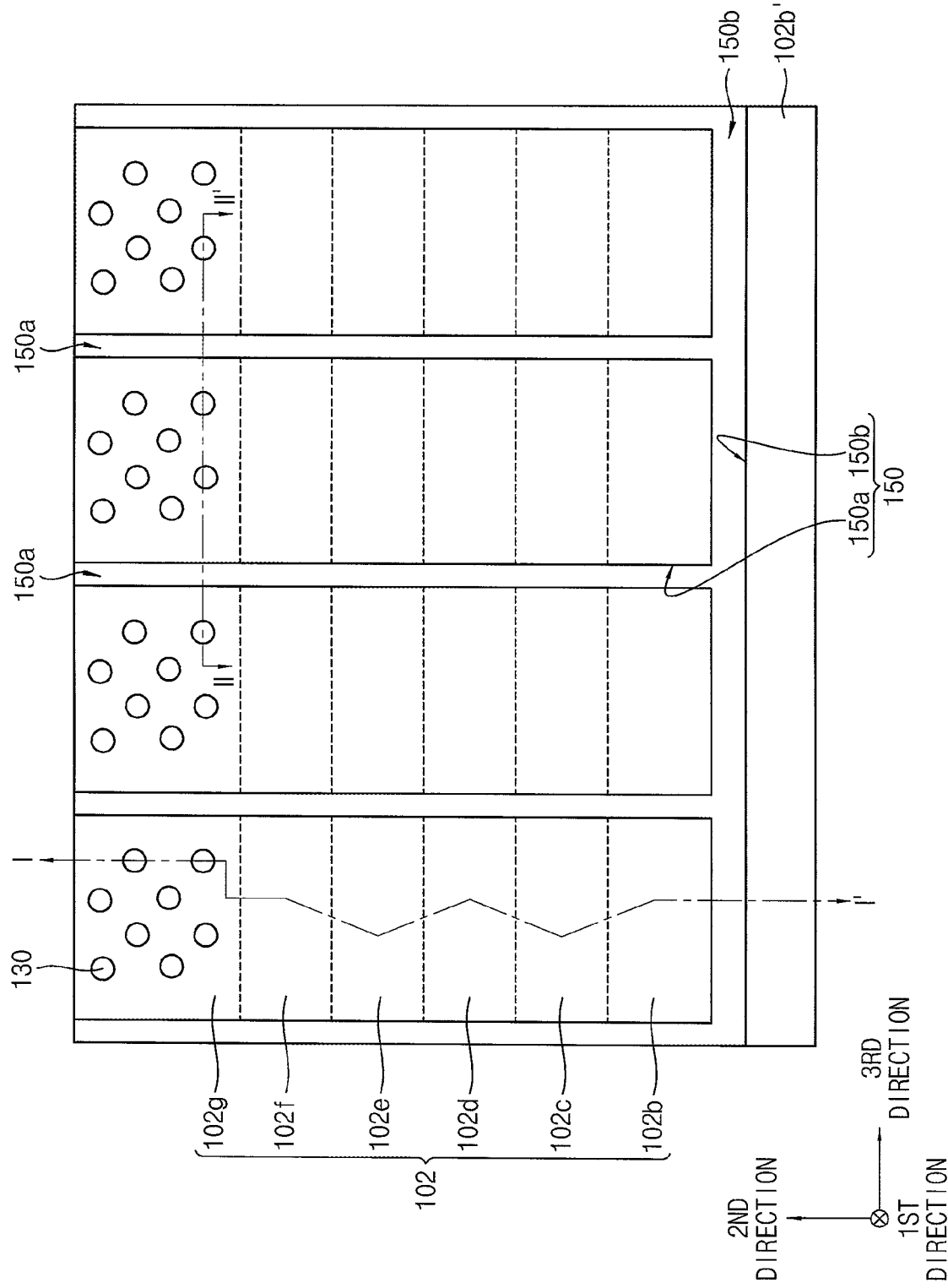
Figure 19:
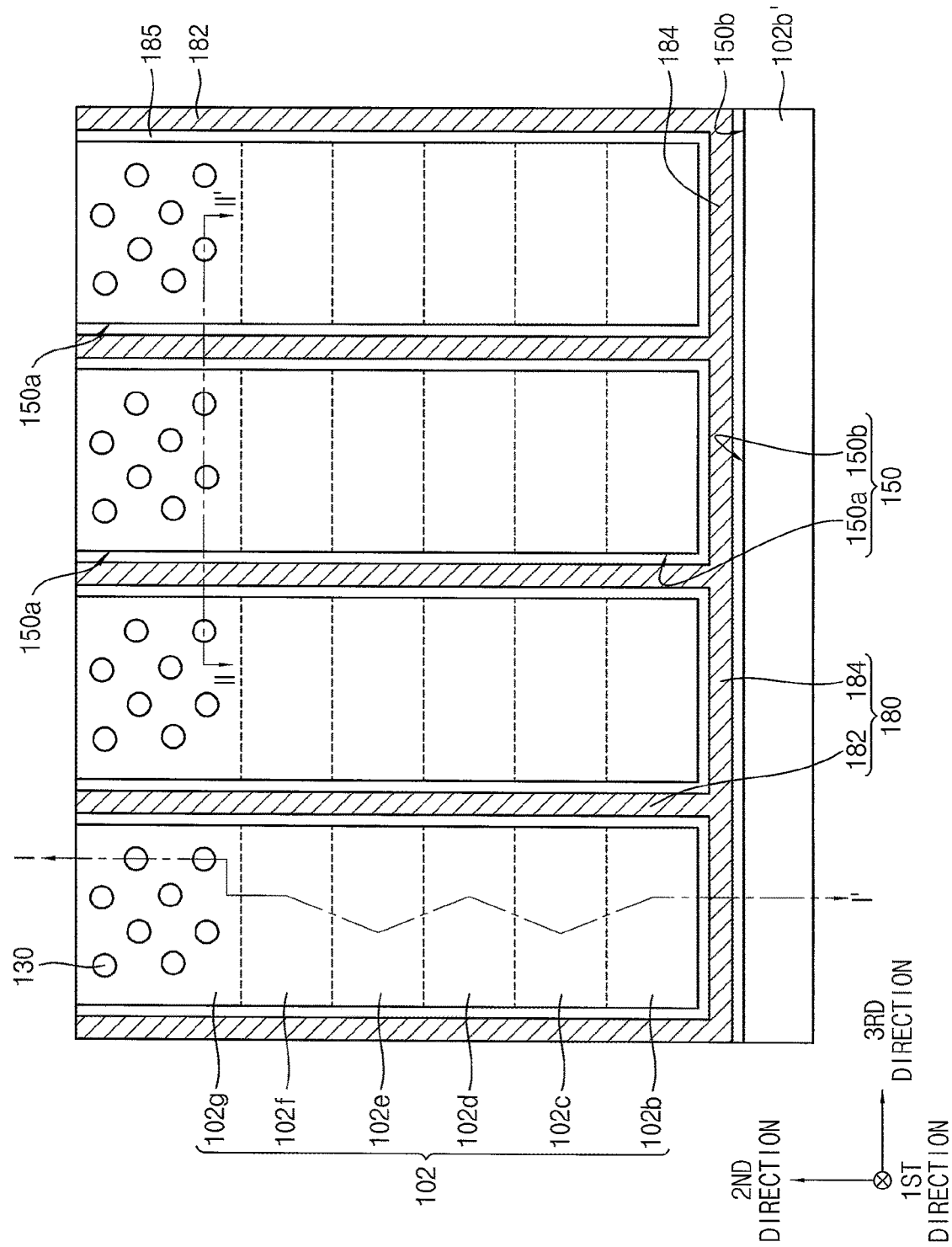

Specifically, FIGS. 9, 12 and 19 are plan views illustrating the method. FIGS. 4-8, 10-11, 13, 15, 17 and 20 are cross-sectional views taken along a line I-I' designated in the plan views and along the first direction. FIGS. 14, 16, 18 and 21 are cross-sectional views taken along a line II-II' designated in the plan views and along the first direction.

Figure 4:
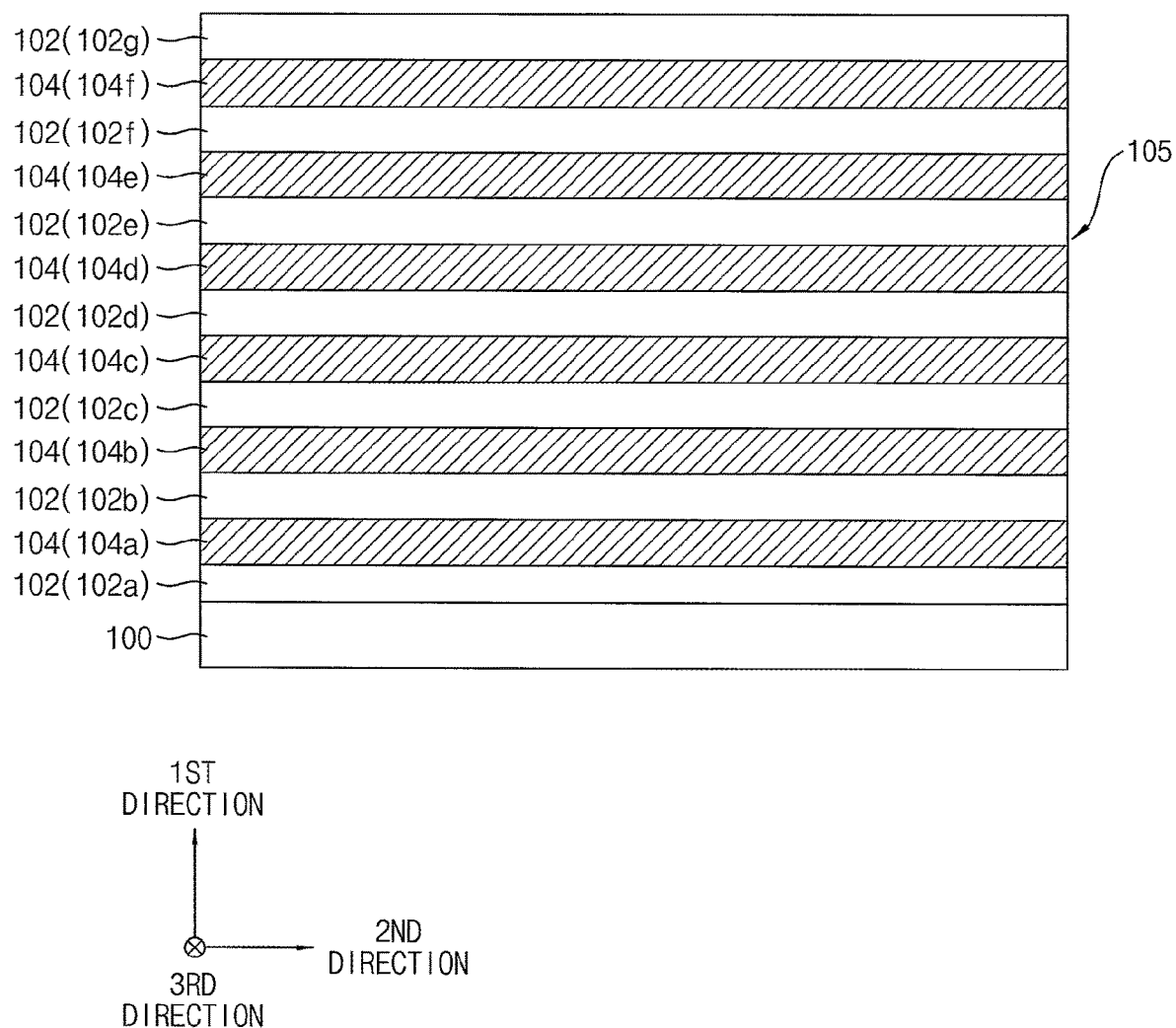

Referring to FIG. 4, insulating interlayers 102 (e.g., 102a~102g) and sacrificial layers 104 (e.g., 104a~104f) may be alternately and repeatedly formed on a substrate 100 to form a mold structure 105.

The substrate 100 may include a semiconductor material, e.g., silicon or germanium. In some example embodiments, a p-type well may be formed by implanting p-type impurities into the substrate 100.

The insulating interlayer 102 may be formed of, e.g., silicon oxide. The sacrificial layer 104 may be formed of a material that may have an etching selectivity with respect to the insulating interlayer 102 and may be easily removed by a wet etching process. For example, the sacrificial layer 104 may be formed of silicon nitride. In an example embodiment, the sacrificial layer 104 may be formed of polysilicon.

The insulating interlayer 102 and the sacrificial layer 104 may be formed by a chemical vapor deposition (CVD) process, a plasma enhanced chemical vapor deposition (PECVD) process, a high density plasma chemical vapor deposition (HDP-CVD) process, an atomic layer deposition (ALD) process or a sputtering process.

The sacrificial layers 104 may be removed by a subsequent process to provide a space for forming a GSL, word lines and an SSL. Thus, the number of the insulating interlayers 102 and the sacrificial layers 104 may be determined in consideration of the number of the GSL, the word lines and the SSL. FIG. 4 illustrates that the sacrificial layers 104 and the insulating interlayers 102 are formed at 6 levels and 7 levels, respectively. However, the number of the insulating interlayers 102 and the sacrificial layers 104 may increase depending on a degree of integration of the vertical memory device.

Referring to FIG. 5, a photoresist pattern 110 may be formed on an uppermost insulating interlayer 102g. A length of the photoresist pattern 110, e.g., in the second direction may be reduced by W1 indicated in FIG. 5 by a first photolithography process using a first photo mask. The uppermost insulating interlayer 102g and an uppermost sacrificial layer 104f may be removed using the reduced photoresist pattern 110 as an etching mask.

Figure 6:
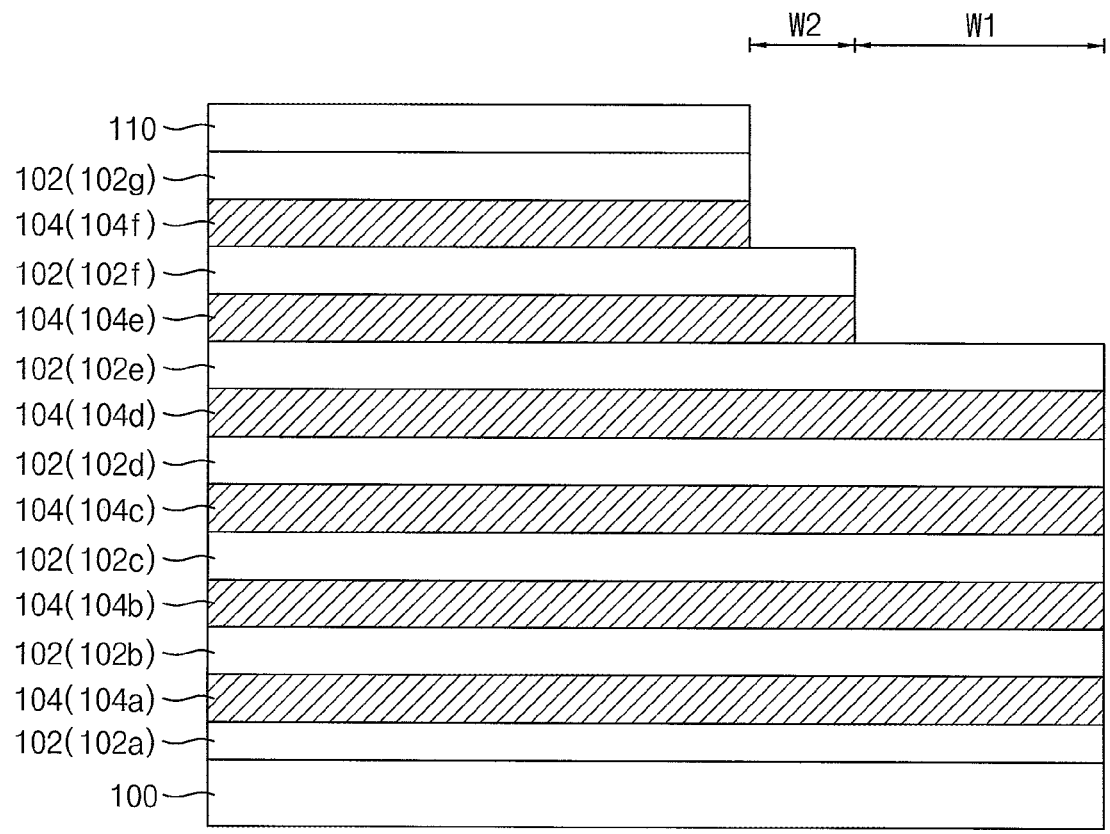

Referring to FIG. 6, the photoresist pattern 110 may be additionally reduced by, e.g., W2 by a second photolithography process using a second photo mask.

One of the insulating interlayer 102 and one of the sacrificial layer 104 may be etched using the reduced photoresist pattern 110 as an etching mask to form step portions in the insulating interlayer 102f and the sacrificial layer 104e, as shown in FIG. 6.

In example embodiments, W1 may be greater than W2, and for example, W1 may be equal to or more than about 2 times W2.

Referring to FIG. 7, the etching process substantially the same as or similar to that illustrated with reference to FIG. 5 may be repeatedly performed. Thus, a plurality of step portions may be formed in each of the insulating interlayers 102 and the sacrificial layers 104 to form a preliminary stepped mold structure 105a. Each of the step portions of the insulating interlayers 102 and the sacrificial layers 104 may have a length of W2.

In example embodiments, in the preliminary stepped mold structure 105a, the lowermost insulating interlayer 102a, e.g., a first insulating interlayer 102a and the lowermost sacrificial layer 104a, e.g., a first sacrificial layer 104a may not be etched but remain. In some example embodiments, a second insulating interlayer 102b on the first sacrificial layer 104a may not be etched but remain.

The photoresist pattern 110 may be removed by an ashing process and/or a stripping process after forming the preliminary stepped mold structure 105a.

Referring to FIG. 8, a mold protection layer 115 may be formed to cover the preliminary stepped mold structure 105a.

In example embodiments, the mold protection layer 115 may cover the uppermost insulating interlayer 102g and the second insulating interlayer 102b, and may also cover the step portions of the preliminary stepped mold structure 105a. In some example embodiments, an upper portion of the mold protection layer 115 may be planarized by a chemical mechanical polishing (CMP) process.

The mold protection layer 115 may be formed by a CVD process, a spin coating process etc., using silicon oxide, e.g., TEOS, PEOX, siloxane, silsesquioxane, etc.

Referring to FIGS. 9 and 10, channel holes 120 may be formed through the preliminary stepped mold structure 105a.

For example, a hard mask (not illustrated) may be formed on the mold protection layer 115, and the insulating interlayers 102 and the sacrificial layers 104 of the preliminary stepped mold structure 105a may be partially etched by performing, e.g., a dry etching process using the hard mask to form the channel holes 120.

The channel hole 120 may extend in the first direction through the insulating interlayers 102 and the sacrificial layers 104 from the uppermost insulating interlayer 102g to the lower most insulating interlayer 102a. An upper surface of the substrate 100 may be exposed by the channel hole 120. In some example embodiments, an upper portion of the substrate 100 may be also etched by the dry etching process for forming the channel hole 120.

The hard mask may be formed of silicon-based or carbon-based spin-on hardmask (SOH) materials, and/or a photoresist material.

As illustrated in FIG. 9, a plurality of the channel holes 120 may be formed in the second direction to form a channel hole row. A plurality of channel hole rows may be formed in the third direction. The channel hole rows may be arranged such that the channel holes 120 may be formed in a zigzag layout along the second direction and/or the third direction.

The hard mask may be removed by an ashing process and/or a stripping process after forming the channel hole 120.

Referring to FIG. 11, a vertical channel structure 128 including a dielectric layer structure 122, a channel 124 and a filling pattern 126 may be formed in the channel hole 120. A capping pad 130 may be formed on the vertical channel structure 128 to fill an upper portion of the channel hole 120.

In example embodiments, a dielectric layer may be formed on a sidewall of the channel hole 120, the exposed upper surface of the substrate 100 and an upper surface of the mold protection layer 115. Portions of the dielectric layer on the exposed upper surface of the substrate 100 and the upper surface of the mold protection layer 115 may be removed by an etch-back process to form a dielectric layer structure 122 on the sidewall of the channel hole 120. The dielectric layer structure 122 may have a hollow cylindrical shape.

The dielectric layer may be formed by sequentially forming a blocking layer, a charge storage layer and a tunnel insulation layer. In some embodiments, the dielectric layer may be formed as an oxide-nitride-oxide (ONO) layered structure.

A channel layer may be formed on the upper surface of the mold protection layer 115, an inner sidewall of the dielectric layer structure 122 and the exposed upper surface of the substrate 100, and a filling layer may be formed on the channel layer to fill a remaining portion of the channel hole 120. For example, upper portions of the filling layer and the channel layer may be planarized until the upper surface of the mold protection layer 115 may be exposed to form the channel 124 and the filling pattern 126 in the channel hole 120.

The channel 124 may have a cup-like shape, and may contact the upper surface of the substrate 100. The filling pattern 126 may have a pillar shape contained in a space formed by the channel 124. In some example embodiments, the channel layer may be formed to fill the channel hole 120, and in this case, the filling layer and the filling pattern 126 may not be formed.

The channel layer may be formed of a semiconductor such as polysilicon or amorphous silicon, and may optionally be doped with impurities. In an embodiment, a heat treatment or a laser beam irradiation may be further performed on the channel layer. In this case, the channel layer may include single crystalline silicon. The filling insulation layer may be formed of, e.g., silicon oxide or silicon nitride. The channel layer and the filling layer may be formed by a CVD process, a PECVD process, an ALD process, a PVD process, a sputtering process, etc.

Upper portions of the dielectric layer structure 122, the channel 124 and the filling pattern 126 may be removed by, e.g., an etch-back process to form a recess. A pad layer may be formed on the dielectric layer structure 122, the channel 124, the filling pattern 126, and the mold protection layer 115 to sufficiently fill the recess, and an upper portion of the pad layer may be planarized by, e.g., a CMP process until the upper surface of the mold protection layer 115 may be exposed to form the capping pad 130.

For example, the pad layer may be formed of polysilicon optionally doped with n-type impurities by a sputtering process or an ALD process. In an embodiment, a preliminary pad layer including amorphous silicon may be formed, and then a crystallization process may be performed thereon to form the pad layer.

According to the arrangement of the channel row, a plurality of capping pads 130 may define a pad row in the mold protection layer 115, and a plurality of the pad rows may be formed along the third direction. A channel row may be defined under the pad row, and a plurality of the channel rows may be arranged along the third direction.

Figure 13:
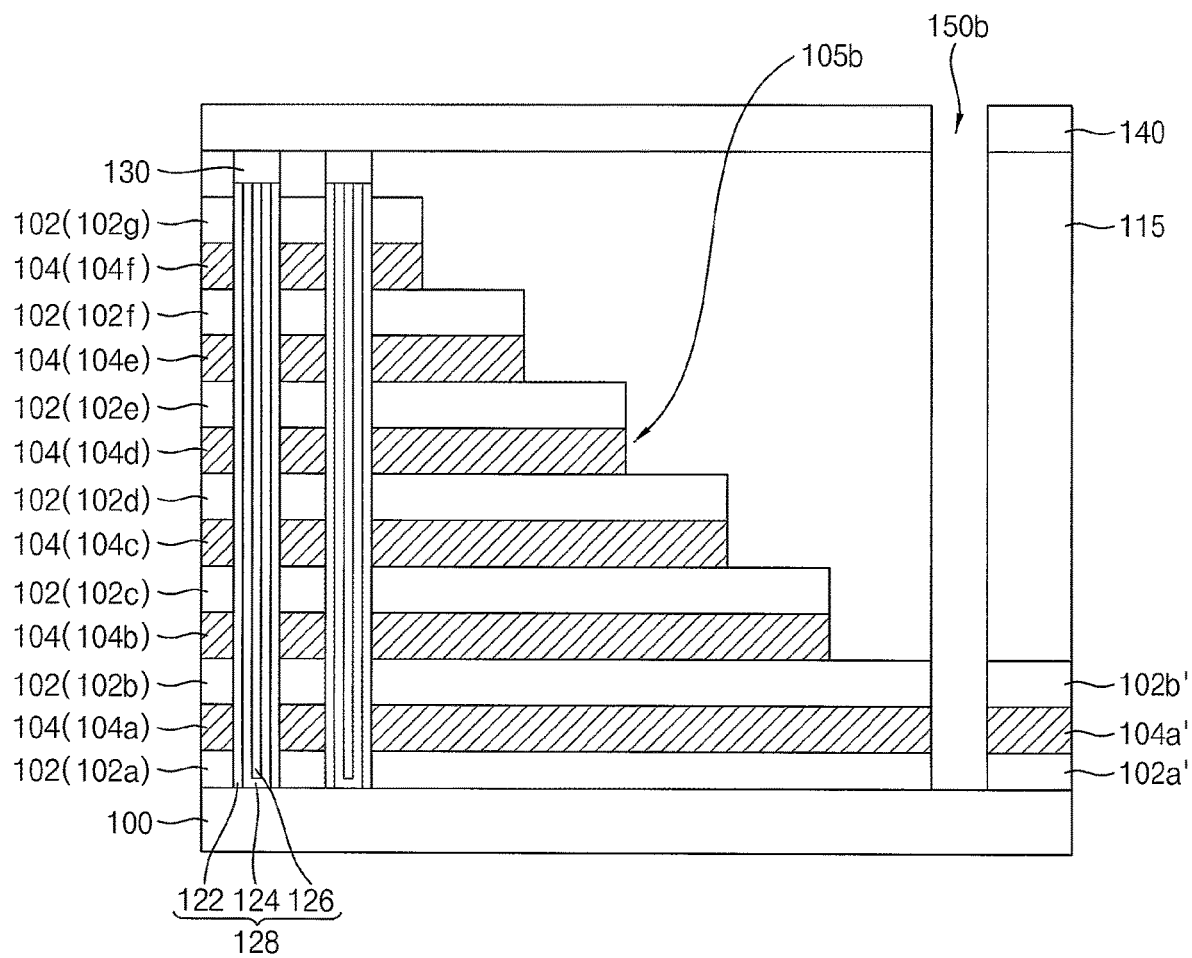
Figure 14:
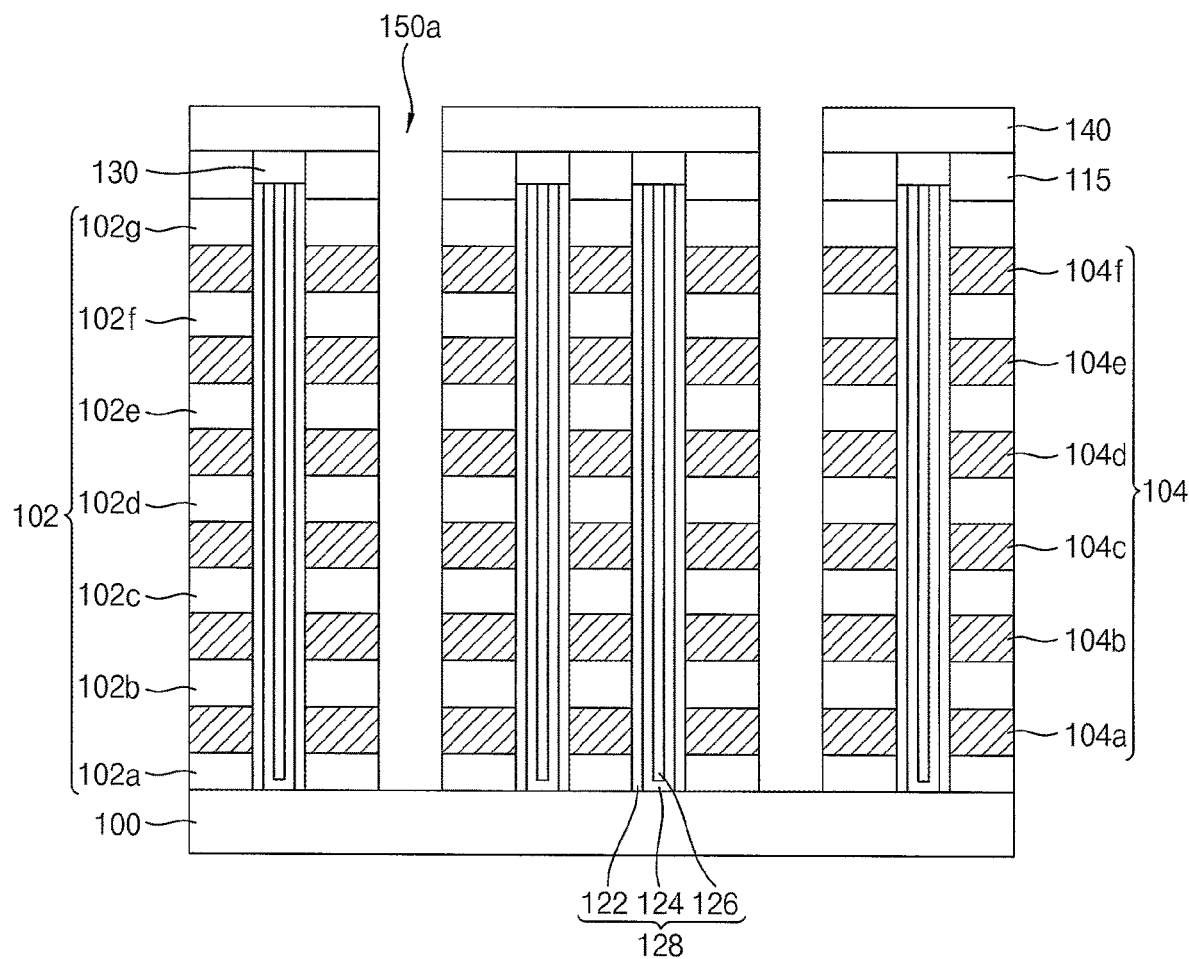

Referring to FIGS. 12 to 14, a first upper insulation layer 140 may be formed on the mold protection layer 115 to cover the capping pads 130. The first upper insulation layer 140 may be formed of, e.g., silicon oxide by a CVD process. The first upper insulation layer 140, the mold protection layer 115 and the preliminary stepped mold structure 105a may be etched by, e.g., a dry etching process to form an opening 150.

In example embodiments, the opening 150 may be formed through the mold protection layer 115 and the preliminary stepped mold structure 105a, and may include first and second opening portions 150a and 150b. An upper surface of the substrate 100 may be exposed by the opening 150. Sidewalls of the insulating interlayers 102 and the sacrificial layers 104 may be exposed by the opening 150.

The first opening portion 150a may extend in the second direction, and may cut the preliminary stepped mold structure 105. A plurality of first opening portions 150a may be formed in the third direction.

The channel rows may be divided into a channel block or channel group by the first opening portions 150a in the third direction. For example, as shown in FIG. 12, four channel rows may be included between neighboring ones of the first opening portions 150a. However, the number of the channel rows between the first opening portions 150a may be properly adjusted in consideration of a circuit design or a degree of integration of the vertical memory device.

The second opening portion 150b may cross the first opening portions 150a, and may be connected thereto. For example, the second opening portion 150b may extend in the third direction, and may be connected to end portions of the first opening portions 150a. Thus, the first opening portions 150a may be merged with the second opening portion 150b via the end portions thereof.

In example embodiments, the second opening portion 150b may be formed through the first upper insulation layer 140, the mold protection layer 115, the second insulating interlayer 102b, the first sacrificial layer 104a and the first insulating interlayer 102a. As illustrated above, when the preliminary stepped mold structure 105a shown in FIG. 7 is formed, the second insulating inter layer 102b, the first sacrificial layer 104a and the first insulating interlayer 102a may be cut by the second opening portion 150b.

Thus, as shown in FIG. 13, a lowermost step portion may be formed in the preliminary stepped mold structure 105a by the second opening portion 150b to form a stepped mold structure 105b.

In some example embodiments, portions of the first insulating interlayer 102a, the second insulating interlayer 102b and the first sacrificial layer 104a divided from the stepped mold structure 105b by the second opening portion 150*b* may remain as dummy insulating interlayers 102*a'* and 102*b'* and a dummy sacrificial layer 104*a'*, respectively.

As illustrated above, the lowermost step portion of the stepped mold structure 105*b* may be formed when the etching process for forming the opening 150 is performed. Thus, the number of the photo masks used in the processes for forming the step portions illustrated with reference to FIGS. 5 to 7 may be reduced. Accordingly, the process cost for forming the stepped mold structure 105*b* may be reduced, and the process margin for forming the step portions may be enhanced.

Figure 15:
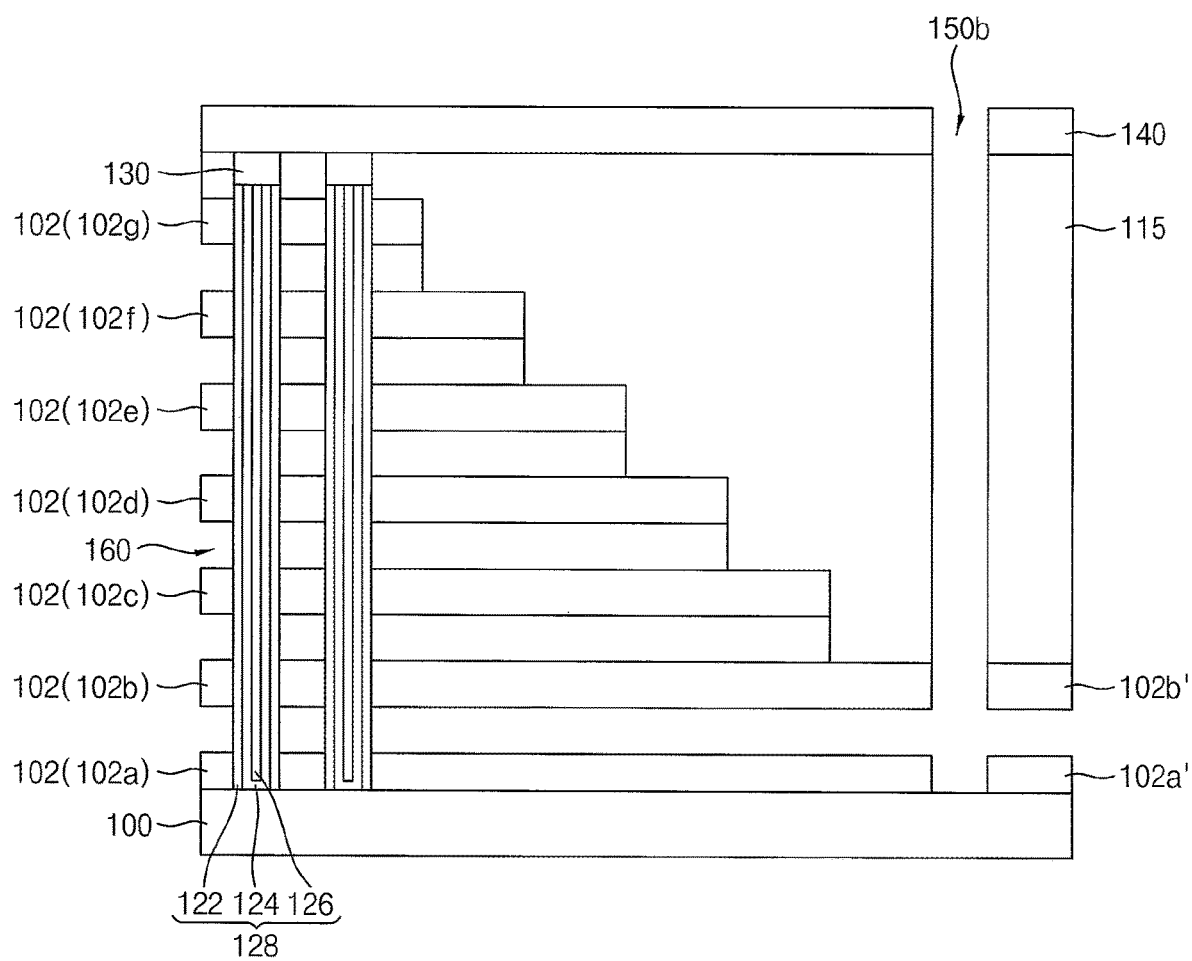
Figure 16:
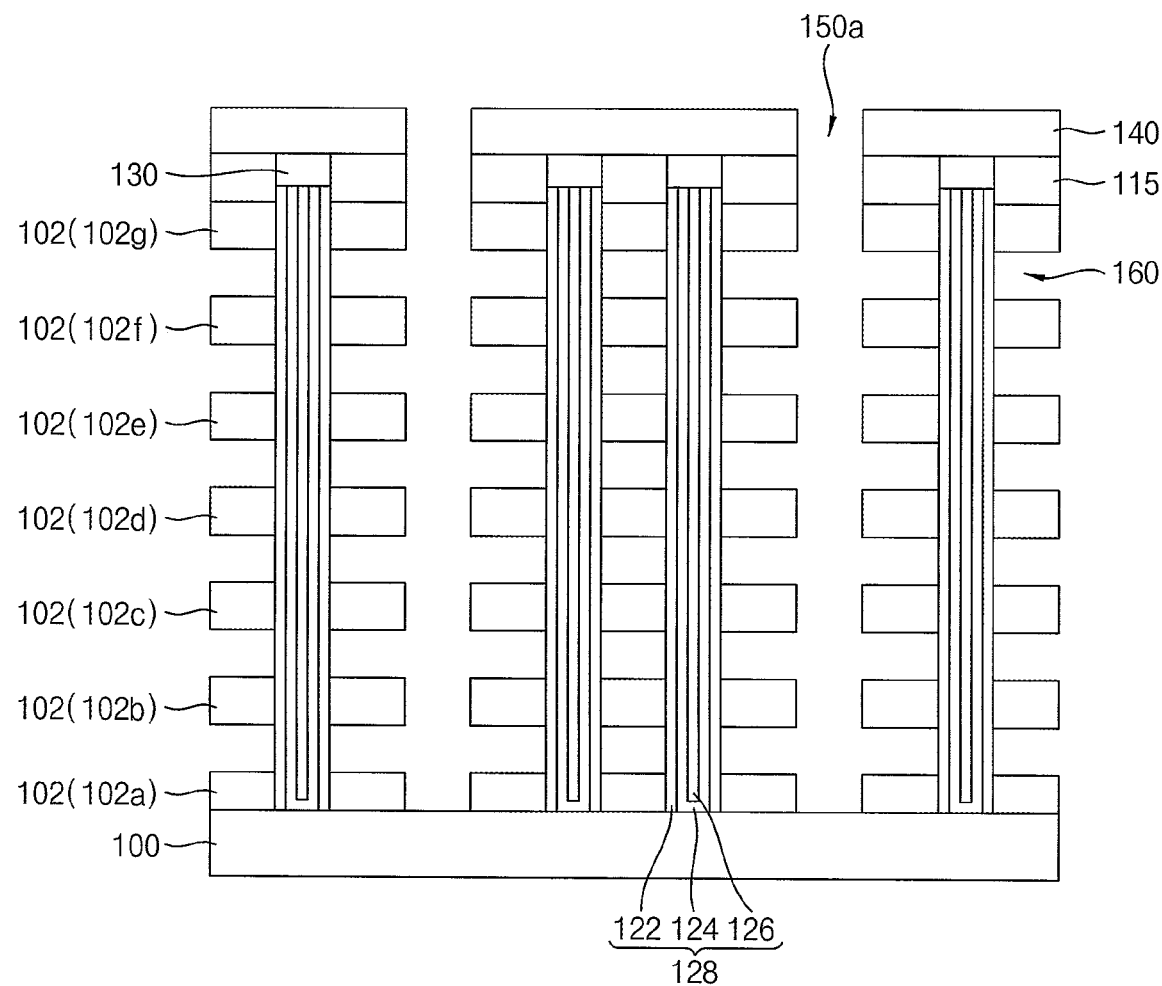

Referring to FIGS. 15 and 16, the sacrificial layers 104 exposed by the opening 150 may be removed. In example embodiments, the sacrificial layers 104 may be removed by a wet etching process using an etching solution having an etching selectivity with respect to silicon nitride. For example, the etching solution may include phosphoric acid. By the etching process, the dummy sacrificial layer 104*a'* may be also removed.

In some example embodiments, when the sacrificial layer 104 includes polysilicon, a gas phase etching (GPE) process may be performed using, e.g., chlorine gas.

As the sacrificial layers 104 are removed, a gap 160 may be formed between the insulating interlayers 102, and an outer sidewall of the vertical channel structure 128 or the dielectric layer structure 122 may be partially exposed by the gap 160. The gap 160 may extend in the second direction, and may be blocked by the mold protection layer 115. In example embodiments, a lowermost one of the gaps 160 may be connected to the second opening portion 150*b*.

Figure 17:
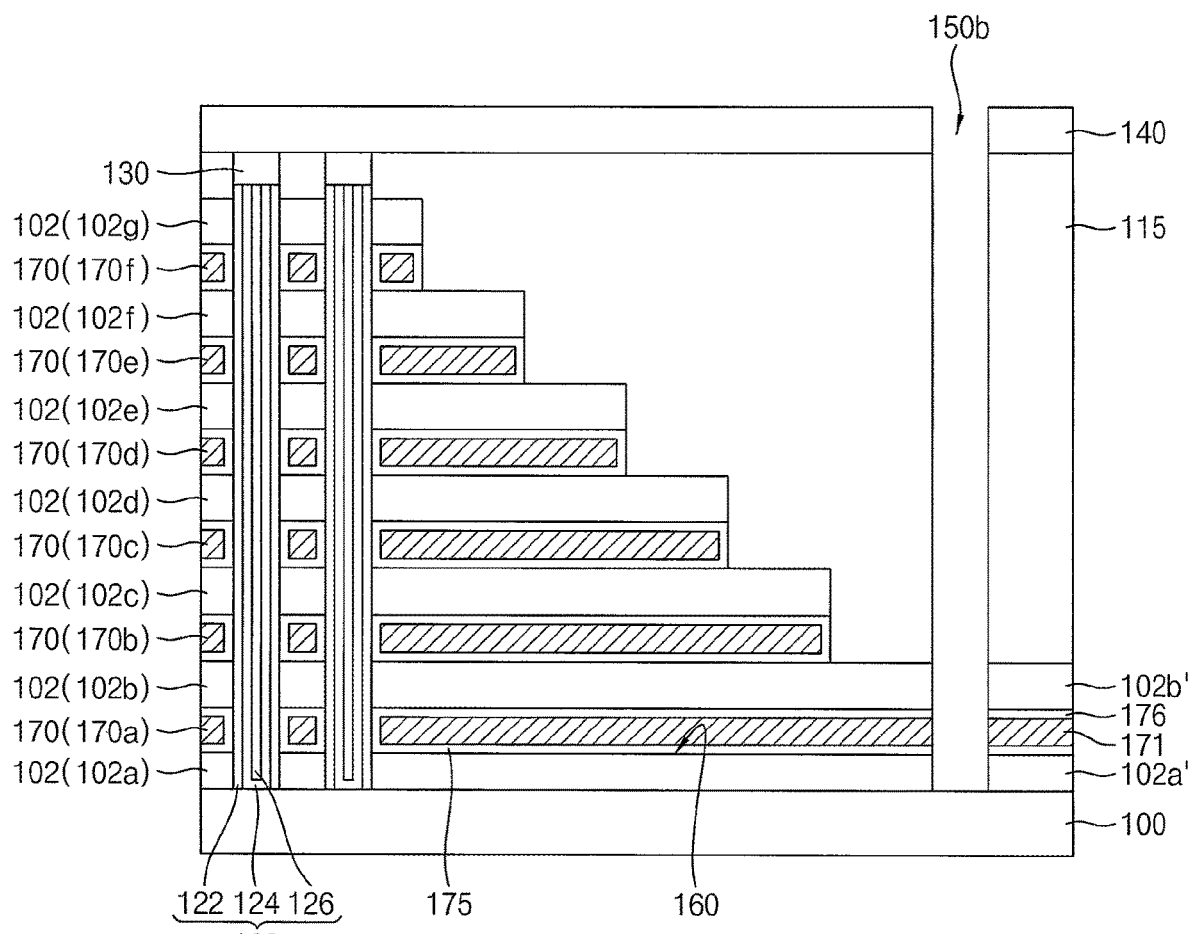

Referring to FIGS. 17 and 18, an interface layer 175 and a gate line 170 (e.g., 170*a*~170*f* may be formed in each of the gaps 160.

The interface layer 175 may be conformally formed on surfaces of the insulating interlayers 102 and the mold protection layer 115, and the outer sidewall of the dielectric layer structure 122.

In some example embodiments, the interface layer 175 may be also formed on the sidewall of the insulating interlayer 102 exposed by the opening 150.

The interface layer 175 may be formed of a metal oxide and/or a metal nitride by an ALD process or a sputtering process.

A gate electrode layer may be formed on the interface layer 175 to fill the gaps 160 and to at least partially fill the opening 150. The gate electrode layer may be also formed on an upper surface of the first upper insulation layer 140.

The gate electrode layer may be formed of a metal or a metal nitride. For example, the gate electrode layer may be formed of tungsten, aluminum, copper, titanium, tantalum, etc., or a metal nitride thereof. In an embodiment, the gate electrode layer may be formed to have a multi-layered structure including a barrier layer formed of a metal nitride, and a metal layer. The gate electrode layer may be formed by a CVD process, a PECVD process, an ALD process, a PVD process, a sputtering process, etc.

The gate electrode layer may be partially removed to form the gate line 170 in the gap 160 at each level. For example, an upper portion of the gate electrode layer may be planarized by a CMP process until the upper surface of the first upper insulation layer 140 may be exposed. Portions of the gate electrode layer formed in the opening 150 and on the upper surface of the substrate 100 may be etched to obtain the gate lines 170.

The gate lines 170 may include the GSL (e.g., the gate line 170*a*), the word lines (e.g., the gate lines 170*b*~170*e*) and the SSL (e.g., the gate line 170*f*) sequentially stacked and spaced apart from one another in the first direction. The number of the levels at which the GSL, the word lines and the SSL are formed may increase in consideration of a circuit design and a capacity of the vertical memory device.

In some example embodiments, a dummy interface layer 176 and a dummy gate line 171 may be formed in a space formed by removing the dummy sacrificial layer 104*a'*.

The gate lines 170, the insulating interlayers 102, and the channel rows surrounded by the gate lines 170 and the insulating interlayers 102 may define a gate line stack structure. A plurality of gate line stack structures may be divided by the first opening portions 150*a*, and may be arranged in the third direction. The GSL (e.g., 170*a*) in each of the gate line stack structures may be defined by the second opening portion 150*b*.

Figure 20:
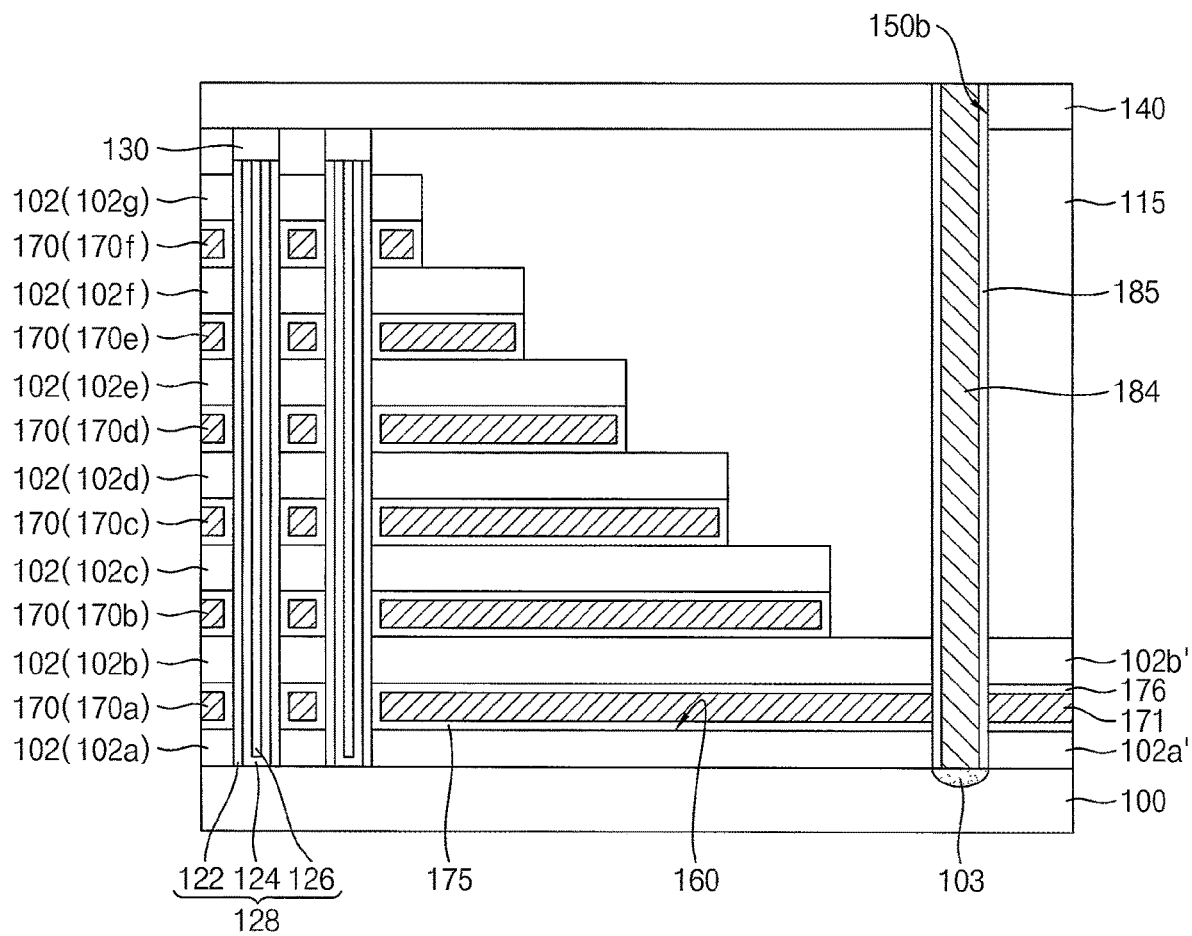

Referring to FIGS. 19 to 21, an ion-implantation process may be performed to form an impurity region 103 at an upper portion of the substrate 100 exposed by the opening 150.

The impurity region 103 may extend in a direction in which the opening 150 may extend. A portion of the impurity region 103 formed by the first opening portion 150*a* may extend in the second direction, and a portion of the impurity region 103 formed by the second opening portion 150*b* may extend in the third direction.

A spacer 185 may be formed on a sidewall of the opening 150. For example, a spacer layer may be formed of an insulating material, e.g., silicon oxide on the upper surface of the first upper insulation layer 140 and a sidewall and a bottom of the opening 150 by an ALD process. For example, an anisotropic etching process or an etch back process may be performed to partially remove the spacer layer so that the spacer 185 may be formed on the sidewall of the opening 150.

In some example embodiments, the spacer 185 may be formed on the sidewall of the opening 150, and then the ion implantation process may be performed through the opening 150 to form the impurity region 103.

A cutting pattern 180 may be formed to fill a remaining portion of the opening 150. In example embodiments, a first conductive layer may be formed on the first upper insulation layer 140 to fill a remaining portion of the opening 150. An upper portion of the first conductive layer may be planarized by a CMP process to form the cutting pattern 180 extending in the opening 150.

The cutting pattern 180 may include a first cutting portion 182, which may fill the first opening portion 150*a* and extend in the second direction, and a second cutting portion 184, which may fill the second opening portion 150*b* and extend in the third direction. The second cutting portion 184 may be connected to a plurality of first cutting portions 182. In some example embodiments, the cutting pattern 180 may serve as a single structure.

The first cutting portion 182 may serve as a boundary pattern defining the gate line stack structure. The second cutting portion 184 may serve as a boundary pattern defining the GSL.

The first conductive layer may be formed of a metal, a metal silicide and/or doped polysilicon by a sputtering process or an ALD process. The cutting pattern 180 may serve as a CSL of the vertical memory device.

Referring to FIGS. 1 to 3 again, a second upper insulation layer 190 may be formed on the first upper insulation layer 140 to cover the cutting pattern 180 and the spacer 185. The second upper insulation layer 190 may include a material substantially the same as that of the first upper insulation layer 140, e.g., silicon oxide by a CVD process.

Contacts 192 (e.g., 192a~192e) may be formed through the first and second upper insulation layers 140 and 190, the mold protection layer 115, and the insulating interlayers 102 to contact or be electrically connected to the gate lines 170 at respectively levels. In some example embodiments, the contacts 192 may also penetrate through the interface layer 175, and may directly contact an upper surface of each of the gate lines 170.

The plug 195 may be formed through the first and second upper insulating interlayers 140 and 190 to contact or be electrically connected to the capping pad 130.

In some example embodiments, contact holes for forming the plugs 195 and the contacts 192 may be formed by the same etching process. In this case, a second conductive layer may be formed to fill the contact holes, and an upper portion of the second conductive layer may be planarized until an upper surface of the second upper insulation layer 190 may be exposed to form the plugs 195 and the contacts 192 simultaneously. The second conductive layer may be formed of a metal, e.g., copper, tungsten, aluminum, etc., by a sputtering process or an ALD process.

Alternatively, the plugs 195 and the contacts 192 may be formed by different etching and deposition processes from each other. For example, after the contacts 192 are formed, a third upper insulation layer (not shown) may be formed on the second upper insulation layer 190 to cover the contacts 192. The plugs 195 may be formed through the first and second upper insulation layers 140 and 190 and the third upper insulation layer to contact or be electrically connected to the capping pad 130.

In some example embodiments, bit lines (not shown) and wirings (not shown) may be further formed on the second upper insulation layer 190 to be electrically connected to the plugs 195 and the contacts 192, respectively.

Figure 22:
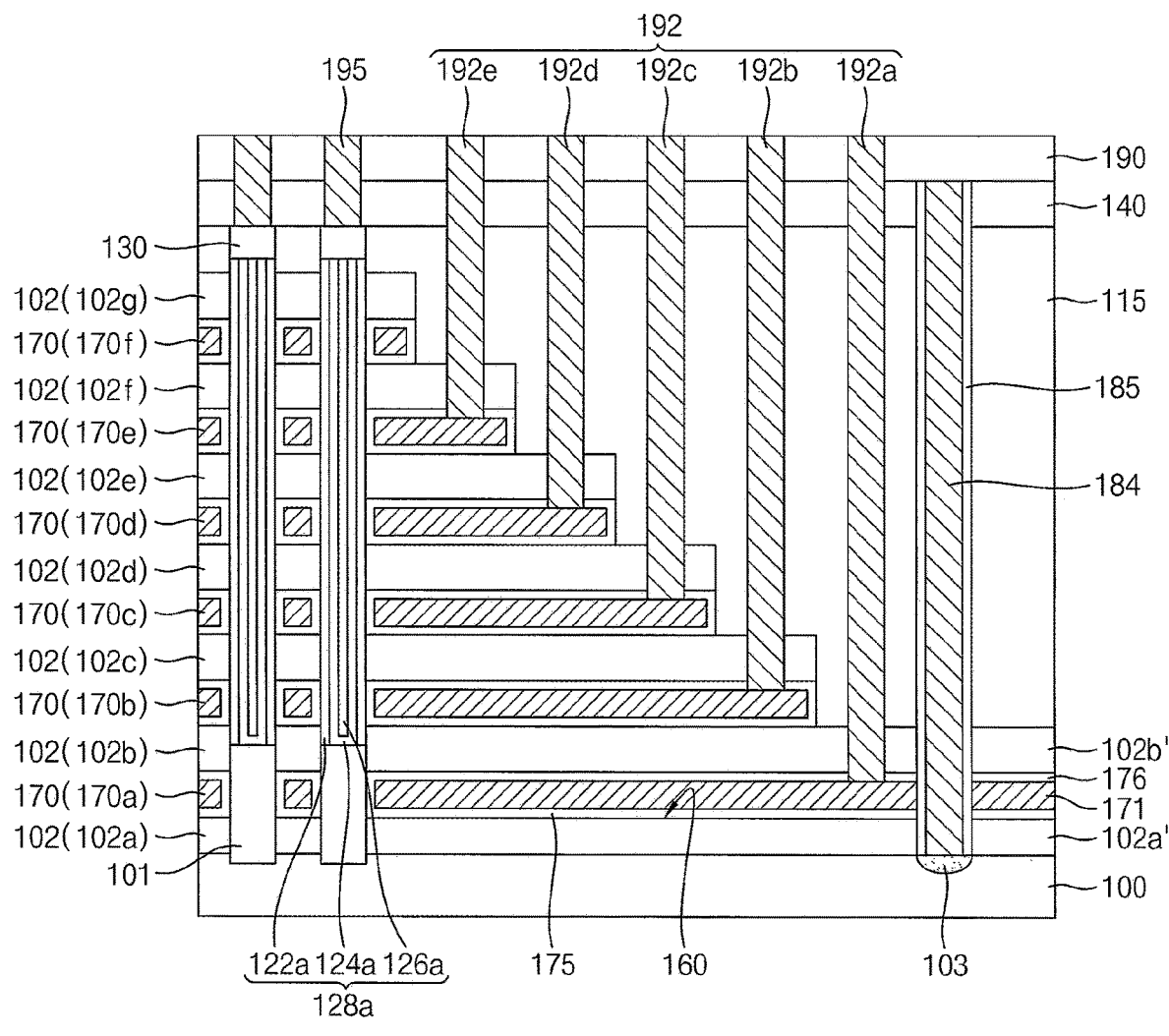

FIG. 22 is a cross-sectional view illustrating a vertical memory device in accordance with example embodiments. For example, FIG. 22 is a cross-sectional view taken along the line I-I' of FIG. 1 in the first direction.

The vertical memory device of FIG. 22 may be substantially the same as or similar to that of FIGS. 1 to 3, except for a channel column 101. Thus, like reference numerals refer to like elements, and detailed descriptions thereon may be omitted below in the interest of brevity.

Referring to FIG. 22, the channel column 101 may be formed by forming a channel hole 120 as illustrated with reference to FIGS. 9 and 10, and performing a selective epitaxial growth (SEG) process on the exposed upper surface of the substrate 100 by the channel hole 120. A vertical channel structure 128a including a dielectric layer structure 122a, a channel 124a and a filling pattern 126a may be formed on the channel column 102 by processes substantially the same as or similar to those illustrated with reference to FIG. 11.

In example embodiments, an upper surface of the channel column 101 may be located between an upper surface of the first gate line 170a and a lower surface of the second gate line 170b. For example, the channel column 101 may serve as a channel of the GSL. The interface layer 175 may serve as a gate insulation layer of the GSL.

In some example embodiments, as shown in FIG. 22, a bottom of the channel column 102 may be partially inserted into an upper portion of the substrate 100.

FIG. 23 is a cross-sectional view illustrating a vertical memory device in accordance with example embodiments. For example, FIG. 23 is a cross-sectional view taken along the line II-II' of FIG. 1 in the first direction.

The vertical memory device of FIG. 23 may be substantially the same as or similar to that of FIGS. 1 to 3, except for the shape of the vertical channel structure. Thus, like reference numerals refer to like elements, and detailed descriptions thereon may be omitted below in the interest of brevity.

Referring to FIG. 23, neighboring ones of the vertical channel structures may be connected to each other through an inner portion of the substrate 100.

In some example embodiments, a trench 100a may be formed at an upper portion of the substrate 100. A dielectric layer structure 122b and a channel 124b included in a pair of vertical channel structures may be formed on the trench 100a to be connected with each other. A filling pattern 126b may be formed on the channel 124b to fill the trench 100a and remaining portions of the pair of vertical channel structures.

Figure 24:
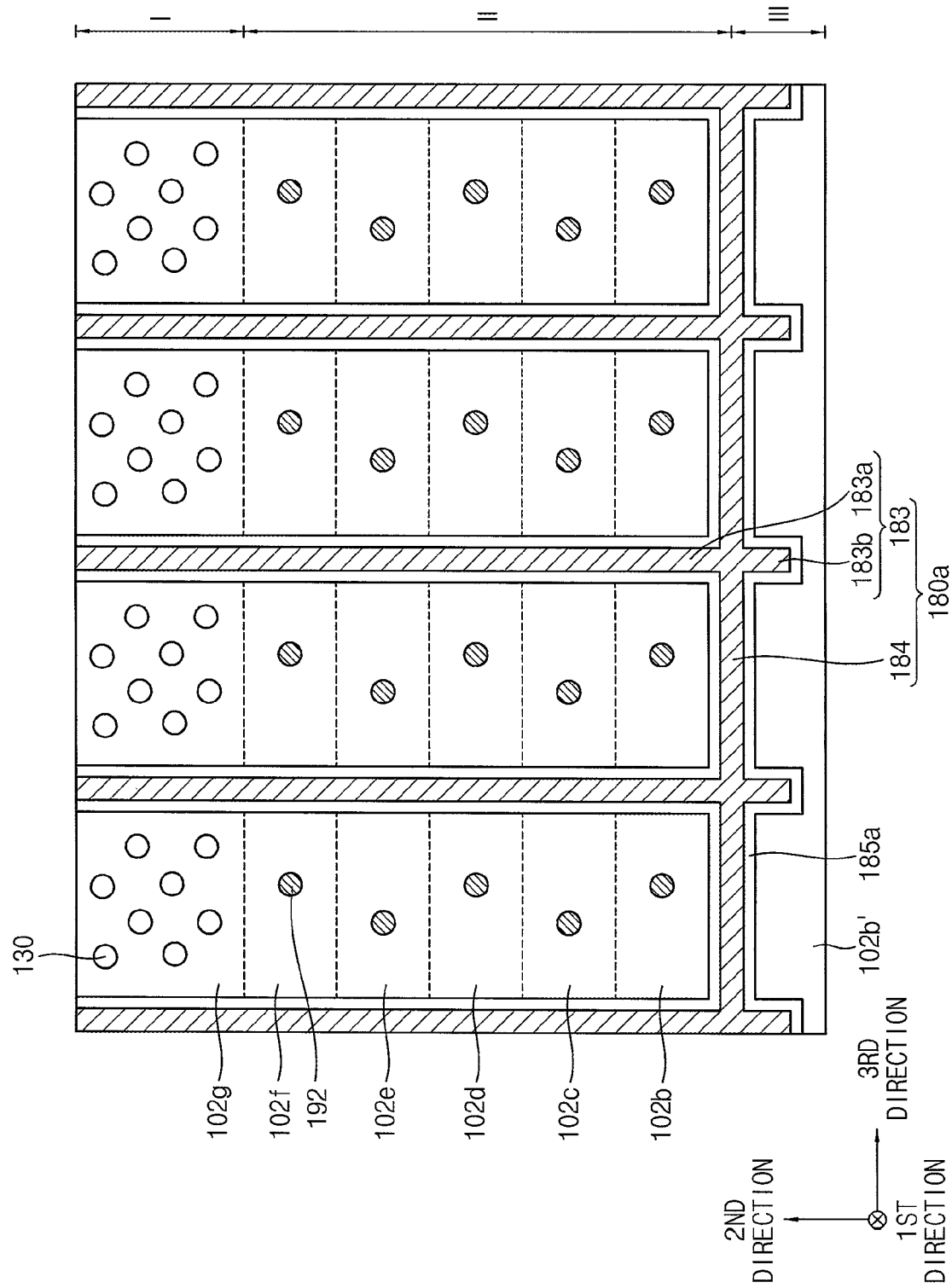

FIG. 24 is a plan view illustrating a vertical memory device in accordance with example embodiments. The vertical memory device of FIG. 24 may be substantially the same as or similar to that of FIGS. 1 to 3, except for the shape and/or structure of the cutting pattern. Thus, like reference numerals refer to like elements, and detailed descriptions thereon may be omitted below in the interest of brevity.

Referring to FIG. 24, the substrate 100 may include first, second and third regions I, II and III. The capping pad 130 and the vertical channel structure may be formed on the first region I of the substrate 100, and step portions of the insulating interlayers 102 and the gate lines may be formed on the second region II of the substrate 100.

The cutting pattern 180a may include a first cutting portion 183 and the second cutting portion 184. The first cutting portion 183 may extend in the second direction, and a plurality of first cutting portions 183 may be formed in the third direction. The gate line stack structures may be divided by the first cutting portions 183. The contacts 192 may be connected to the step portions of the gate lines included in the gate line stack structure.

The second cutting portion 184 may extend in the third direction, and a plurality of first cutting portions 183 may be connected to each other via the second cutting portion 184. The second cutting portion 184 may be disposed at a boundary between the second and third regions II and III, and may define or restrict the GSL. A sidewall of the cutting pattern 180 may be surrounded by a spacer 185a.

In example embodiments, the second cutting portion 184 may be connected to the first cutting portions 183 at inner sides of the first cutting portions 183 from end portions thereof. For example, the first cutting portion 183 may include a first portion 183a, which may extend toward the second region II from the second cutting portion 184, and a second portion 183b, which may extend toward the third region III from the second cutting portion 184.

The second portion 183b of the first cutting portion 183 may protrude to the third region III. Due to the second portion 183b of the first cutting portion 183, an arrangement margin of the second cutting portion 184 may be increased. Additionally, the area or volume of the CSL may increase to reduce the resistance thereof, due to the second portion 183b. In an example embodiment, the second portion 183b may serve as a tab for connecting contacts or plugs connected to the CSL.

Figure 25:
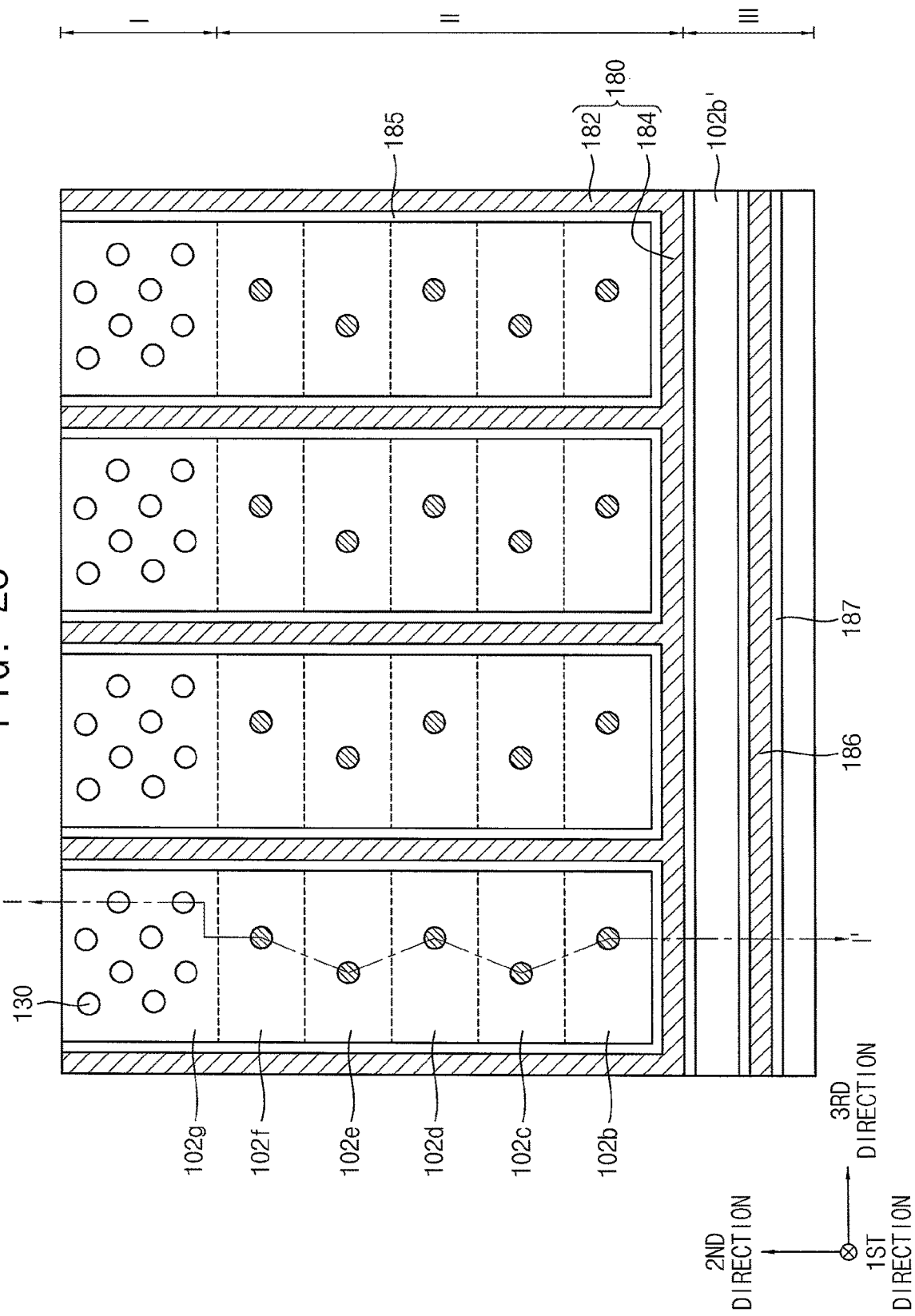
Figure 26:
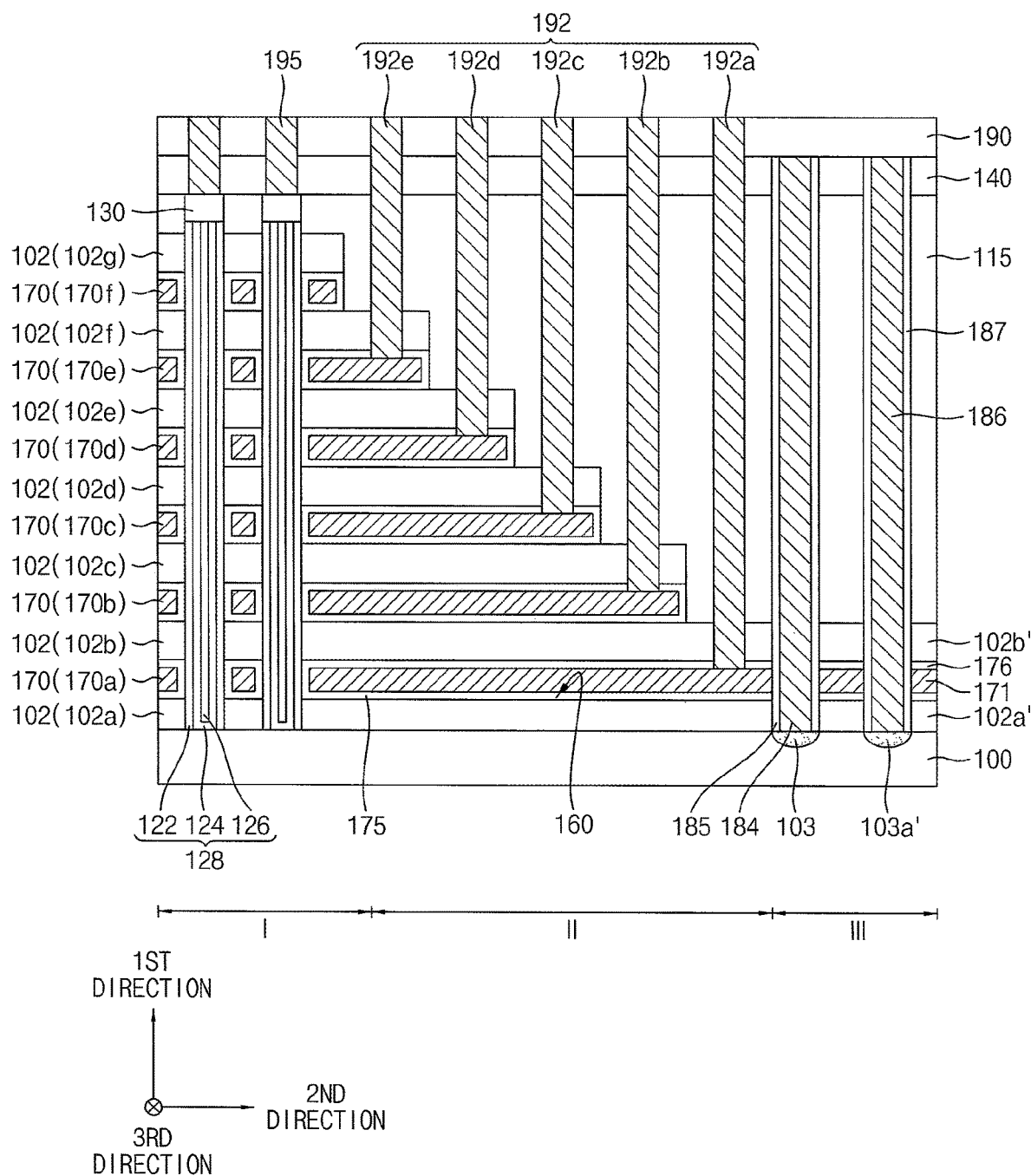

FIGS. 25 and 26 are a plan view and a cross-sectional view illustrating a vertical memory device in accordance with example embodiments. For example, FIG. 26 is a cross-sectional view taken alone the line I-I' of FIG. 25 in the first direction.

The vertical memory device of FIGS. 25 and 26 may be substantially the same as or similar to that of FIGS. 1 to 3, except for a dummy cutting pattern. Thus, like reference numerals refer to like elements, and detailed descriptions thereon may be omitted below in the interest of brevity.

Referring to FIGS. 25 and 26, the vertical memory device may further include a dummy cutting pattern 186 on the third region III of the substrate 100. A dummy spacer 187 may be formed on a sidewall of the dummy cutting pattern 186.

The dummy cutting pattern 186 may have a shape substantially the same as or similar to that of the second cutting portion 184, and may be spaced apart from the first and second cutting portions 182 and 184 in the second direction. In example embodiments, the dummy cutting pattern 186 may extend in the third direction, and may penetrate through the first upper insulation layer 140, the mold protection layer 115, the dummy insulating interlayers 102b' and 102a', the dummy interface layer 176 and the dummy gate line 171.

In some example embodiments, a dummy impurity region 103a' may be formed at an upper portion under the dummy cutting pattern 186, and the dummy cutting pattern 186 may contact the dummy impurity region 103a'.

In example embodiments, the opening 150 (refer to FIGS. 1 to 3) for forming the cutting pattern 180 and a dummy opening for forming the dummy cutting pattern 186 may be formed by the same etching process. Thus, the etching load on the opening 150 may be reduced by the dummy opening, and the structural and mechanical stability and reliability of the cutting pattern 180 may be enhanced.

Figure 27:
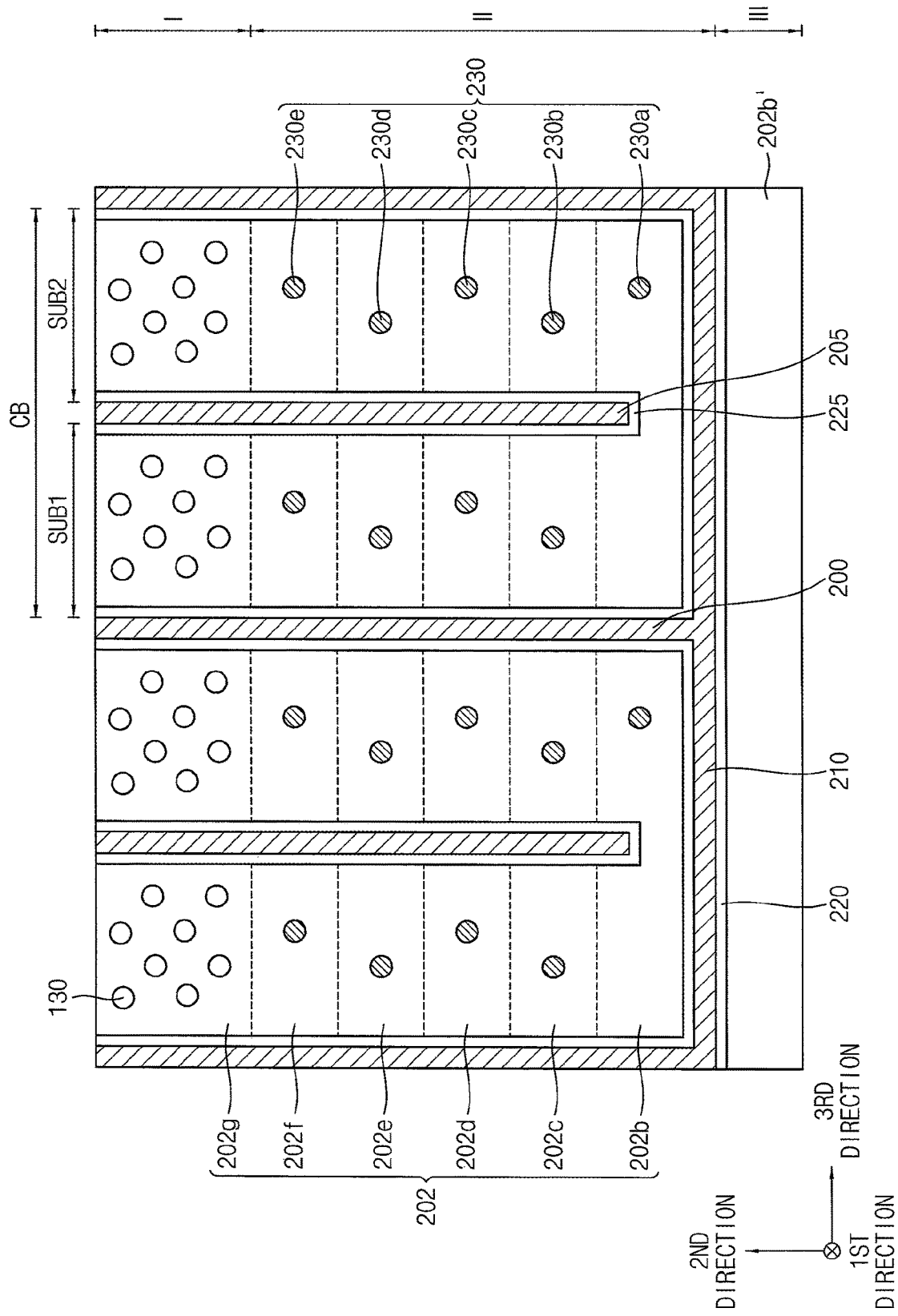
Figure 28:
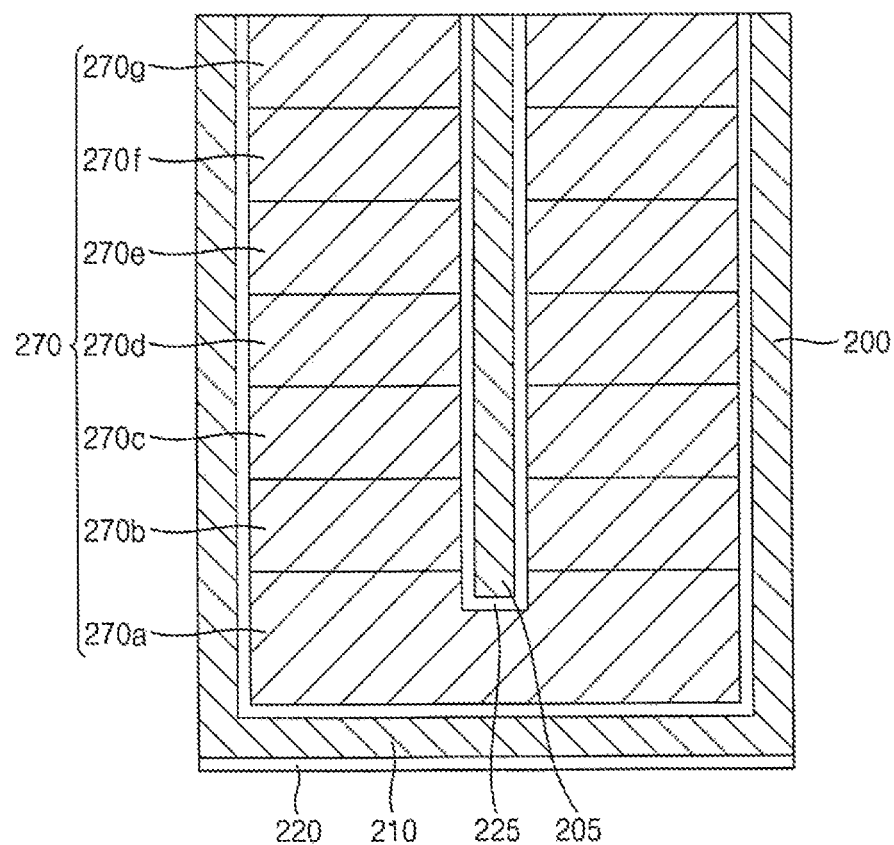

FIGS. 27 and 28 are plan views illustrating a vertical memory device in accordance with example embodiments. For example, FIG. 28 is a plan view of a cell block for showing the arrangement of the gate lines. The vertical memory device of FIGS. 27 and 28 may include elements substantially the same as or similar to those of FIGS. 1 to 3. Thus, like reference numerals refer to like elements, and detailed descriptions thereon may be omitted below in the interest of brevity.

Referring to FIGS. 27 and 28, the vertical memory device may include first, second and third regions I, II and III. Insulating interlayers 202 and gate lines 270 may be alternately formed on the first and second regions I and II of a substrate. Vertical channel structures penetrating through the insulating interlayers 202 and the gate lines 270, and the capping pads 130 may be formed on the first region I of the substrate. Step portions of the insulating interlayers 202 and the gate lines 270 may be formed on the second region II of the substrate. A dummy insulating interlayer 202b' and a dummy gate line (not shown) may be formed on the third region III of the substrate.

A cutting pattern may cut the insulating interlayers 202 and the gate lines 270 by a given unit, and may include first cutting portion 200, a second cutting portion 210, and a sub-cutting portion 205. A spacer 220 may be formed on sidewalls of the first cutting portion 200 and the second cutting portion 210, and a sub-spacer 225 may be formed on a sidewall of the sub-cutting portion 205.

The first cutting portion 200 may extend in the second direction, and a plurality of first cutting portions 200 may be formed in the third direction. In example embodiments, a cell block CB may be defined by neighboring ones of the first cutting portions 200 in the third direction. The second cutting portion 210 may extend in the third direction, and may be connected to a plurality of first cutting portions 200. A length of a GSL 270a in the second direction may be restricted by the second cutting portion 210.

The sub-cutting portion 205 may extend in the second direction as the first cutting portion 200. The sub-cutting portion 205 may be disposed between neighboring ones of the first cutting portions 200 in the third direction, and may be physically divided from the second cutting portion 210. In example embodiments, the sub-cutting portion 205 may be spaced apart from the second cutting portion 210 in the second direction.

In example embodiments, as shown in FIG. 28, the sub-cutting pattern 205 may extend in the first direction. The sub-cutting pattern 205 may cut, e.g., an SSL 270g and word lines 270f~270b, and the GSL 270a may not completely divided by the sub-cutting portion 205. In some example embodiments, the sub-cutting pattern 205 may partially cut step portions of the GSL 270a.

In some example embodiments, as shown in FIG. 27, the cell block CB may be defined by neighboring ones of the first cutting portions 200 in the third direction, and two sub-blocks, e.g., a first sub-block SUB1 and a second sub-block SUB2 may be defined in the cell block CB by the sub-cutting portion 205.

For example, the first and second sub-blocks SUB1 and SUB2 and the word lines 270f~270b may be physically divided by the sub-cutting portion 205. The first and second sub-blocks SUB1 and SUB2 may share the GSL 270a. As shown in FIG. 28, the GSL 270a that is a single structure may be provided in the first and second sub-blocks SUB1 and SUB2.

Contacts 230 (e.g., 230a~230e) may be connected to step portions of the gate lines 270. In some example embodiments, the contact connected to the SSL 270g and the contacts 230b~230e connected to the word lines 270f~270b may be disposed in each of the first and second sub-blocks SUB1 and SUB2. The contact 230a connected to the GSL 270a may be provided in each cell block CB. For example, the contact 230a connected to the GSL 270a may be commonly provided for the first and second sub-blocks SUB1 and SUB2.

As illustrated above, the cell block CB may be divided into sub-blocks sharing the GSL 270a by forming the sub-cutting portion 205, and the number of contacts for electrically connecting the GSL 270a. Thus, the margin for forming the contact 230 may be obtained, and the operation efficiency of the vertical memory device may be enhanced.

Figure 29:
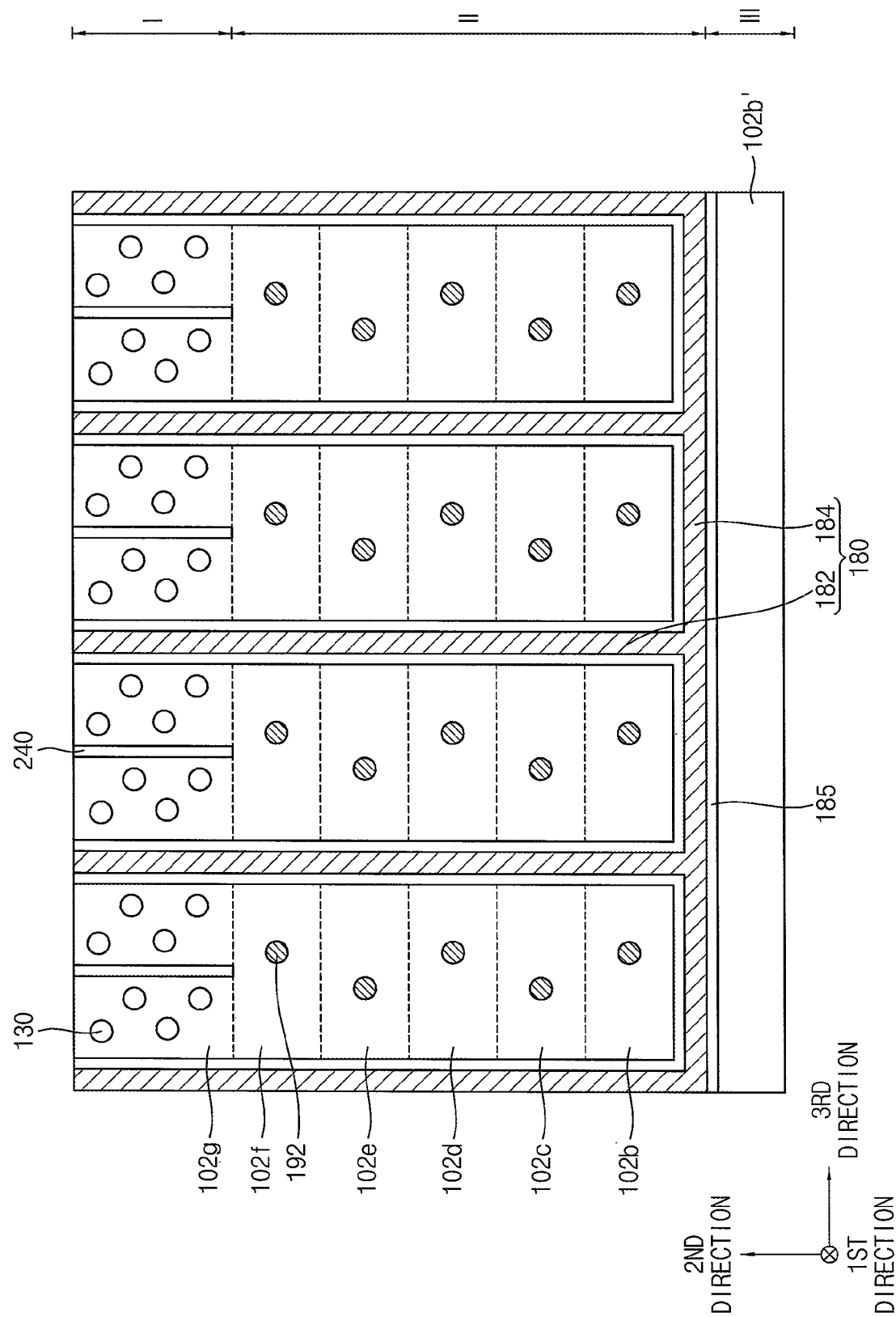

FIG. 29 is a plan view illustrating a vertical memory device in accordance with example embodiments. The vertical memory device of FIG. 29 may include elements substantially the same as or similar to those of FIGS. 1 to 3, except for an SSL cutting pattern 240. Thus, like reference numerals refer to like elements, and detailed descriptions thereon may be omitted below in the interest of brevity.

Referring to FIG. 29, an SSL cutting pattern 240 may be formed on the first region I of the substrate, and may penetrate through the insulating interlayers 102 and the gate lines in the first direction.

In example embodiments, the SSL, e.g., 170f (refer to FIG. 2) in each of the gate line stack structure may be cut by the SSL cutting pattern 240. For example, the SSL 170f in each of the gate line stack structure may be divided into two pieces by the SSL cutting pattern 240.

In some example embodiments, the step portions of the word lines 170e~170b and the GSL 170a may not be cut by the SSL cutting pattern 240. For example, the SSL cutting pattern 240 may be formed only on the first region I of the substrate.

For example, the SSL cutting pattern 240, as illustrated with reference to FIGS. 5 to 7, may be formed before forming the vertical channel structure 128 (refer to FIG. 11) after forming the preliminary stepped mold structure 105a. In some example embodiments, the SSL cutting pattern 240 may be formed before forming the opening 150 (refer to FIG. 12) after forming the vertical channel structure 128.

The SSL cutting pattern 128 may include an insulating material, e.g., silicon oxide.

Figure 30:
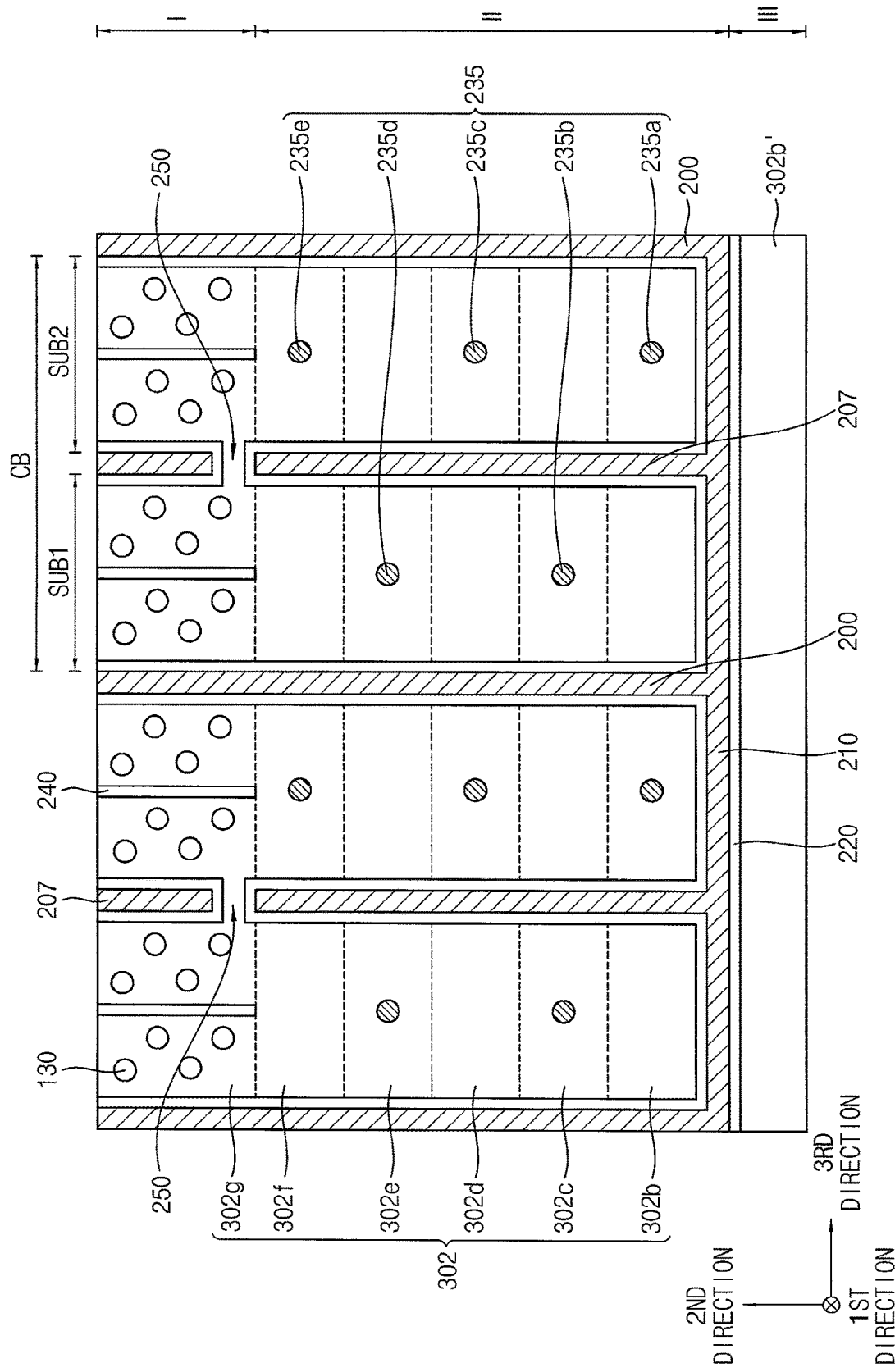

FIG. 30 is a plan view illustrating a vertical memory device in accordance with example embodiments. The vertical memory device of FIG. 30 may include elements substantially the same as or similar to those of FIGS. 1 to 3, FIGS. 27 and 28, or FIG. 29. Thus, like reference numerals refer to like elements, and detailed descriptions thereon may be omitted below in the interest of brevity.

Referring to FIG. 30, as illustrated with reference to FIGS. 27 and 28, the cutting pattern may include the first and second cutting portions 200 and 210. The cell block CB may be defined by the first cutting portions 200 adjacent to each other in the third direction. The first cutting portion 200 may extend in the second direction, and may penetrate through the insulating interlayers 302 and the gate lines.

The second cutting portion 220 may extend in the third direction, and may be merged with the first cutting portions 200. The second cutting portion 210 may be formed at a boundary between the second and third regions II and III, and a dummy insulating interlayer 302b' cut by the second cutting portion 210 may remain on the third region III of the substrate.

In example embodiments, a sub-cutting portion 207 may be formed between neighboring ones of the first cutting portions 200 in the third direction. The cell block CB may be divided into the first and second sub-blocks SUB1 and SUB2 by the sub-cutting pattern 207.

In example embodiments, the sub-cutting pattern 207 may include a cut-off area 250. In some example embodiments, the cut-off area 250 may overlap the first region I of the substrate in a plan view. The gate lines and the insulating interlayers 302 in each level may be connected to each other, respectively, in the cell block CB through the cut-off area. For example, as shown in FIG. 30, each of the gate line and the insulating interlayer 302 in each level may have an H-like shape in a plan view.

In some example embodiments, as illustrated with reference to FIG. 29, the SSL cutting pattern 240 may be formed on the first region I of the substrate, and may divide the SSL.

Contacts 235 (e.g., 235a~235e) may be connected to the step portions of the gate lines. The gate lines may be connected through the cut-off area 250, and thus the contacts 235 may be distributed into different sub-blocks SUB1 and SUB2 in the cell block CB.

As shown in FIG. 30, the contacts 235 may be disposed in a zigzag layout in the first and second sub-blocks SUB1 and SUB2 in a plan view.

As illustrated above, according to the circuit design of the vertical memory device, the operation unit of the vertical memory device may be controlled by using the cutting pattern and/or the sub-cutting portion and the SSL cutting pattern. Additionally, the number of the contacts connected to the gate lines may be reduced to obtain the patterning margin for forming wirings.

The vertical memory device may be applied to a 3-dimensional non-volatile memory device having a high-rise staircase structure including a large number of steps, e.g., 20 steps, 30 steps or 40 steps, and the convenience of process and operation and the reliability of the memory device may be enhanced.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A vertical memory device, comprising:
    a substrate;
    a channel on the substrate, the channel extending in a first direction substantially perpendicular to an upper surface of the substrate;
    gate lines on the substrate, the gate lines spaced apart from each other in the first direction, each of the gate lines surrounding the channel and extending in a second direction substantially parallel to the upper surface of the substrate;
    a cutting pattern on the substrate,
        the cutting pattern including a plurality of first cutting portions extending in the first direction and cutting the gate lines, and
        the cutting pattern including a second cutting portion crossing the first cutting portions and merged with the first cutting portions; and
    a plurality of sub-cutting portions on the substrate, wherein
    the sub-cutting portion includes a conductive material,
    the cutting pattern includes the plurality of first cutting portions spaced apart from each other in a third direction, substantially parallel to the upper surface of the substrate, and extending in the second direction,
    each of the sub-cutting portions is between the plurality of first cutting portions,
    each of the sub-cutting portions extends in the second direction,
    each of the sub-cutting portions cuts the gate lines in the first direction, and
    each of the sub-cutting portions is physically divided from the second cutting portion,
    wherein each of the sub-cutting portions and each of the first cutting portions of the cutting pattern are alternately disposed in the third direction.

2. The vertical memory device of claim 1, wherein the second cutting portion extends in the third direction.

3. The vertical memory device of claim 2, wherein the plurality of first cutting portions include end portions, and
    the second cutting portion is merged with the end portions of the plurality of first cutting portions.

4. The vertical memory device of claim 2, wherein
the plurality of first cutting portions include inner sides, and
the second cutting portion is merged, with the inner sides of the plurality of first cutting portions.

5. The vertical memory device of claim 2, further comprising:
a dummy cutting pattern, on the substrate, wherein
the dummy cutting pattern extends in the third direction, and
the dummy cutting pattern is spaced apart from the gate lines and the second cutting portion in the second direction.

6. The vertical memory device of claim 1, wherein
the gate lines include a ground selection line (GSL), word lines, and a string selection line (SSL), and
each of the first cutting portions cuts the SSL, the word lines and the GSL in the first direction.

7. The vertical memory device of claim 6, wherein the second cutting portion defines a length of the GSL in the second direction.

8. The vertical memory device of claim 1, further comprising:
an insulation spacer on sidewalls of the first cutting portions, the second cutting portion, and the sub-cutting portions, wherein
the first cutting portions and the second cutting portion include the conductive material.

9. A vertical memory device, comprising:
a substrate;
a plurality of gate line stack structures spaced apart from each other on the substrate, each of the plurality of gate line stack structures including:
a channel extending in a first direction substantially perpendicular to an upper surface of the substrate; and
gate lines spaced apart from each other in the first direction, each of the gate lines surrounding the channel and extending in a second, direction substantially parallel to the upper surface of the substrate and crossing a third direction substantially parallel to the upper surface of the substrate, the plurality of gate line stack structures being spaced apart from each other in the third direction; and
a common source line (CSL) surrounding sidewalls of the plurality of gate line stack structures along the second and third directions,
the CSL including first cutting portions and a second cutting portion,
each of the first cutting portions extending in the second direction,
each of the first cutting portions extending in the first direction and cutting the gate lines,
the second cutting portion extending, in the third direction and being merged with the first cutting portions; and
a plurality of sub-cutting portions on the substrate, wherein
each of the sub-cutting portions includes a conductive material,
each of the sub-cutting portions is between the first cutting portions,
each of the sub-cutting portions extends in the second direction,
each of the sub-cutting portions is connected to the second cutting portion, and
each of the sub-cutting portions includes a cut-off area,
wherein each of the sub-cutting portions and each of the first cutting portions of the CSL are alternately disposed in the third direction.

10. The vertical memory device of claim 9, wherein the gate lines divided by the sub-cutting portion are connected to each other through the cut-off area.

11. The vertical memory device of claim 9, wherein
the gate lines are stacked in a staircase shape.

12. The vertical memory device of claim 11, wherein
the plurality of gate line stack structures are divided by the first cutting portions of the CSL, and
a step portion of a lowermost one of the gate lines is defined by the second cutting portion of the CSL.

13. A vertical memory device, comprising:
a substrate;
a plurality of gate lines stacked on top of each other on the substrate, the plurality of gate lines including end portions that extend different lengths parallel to an upper surface of the substrate to define a staircase shape;
a plurality of vertical channels on the substrate that are spaced apart from each other and extend through the plurality of gate lines; and
a common source line (CSL) including first cutting portions that cross into a second cutting portion of the CSL on the substrate, extend through the plurality of gate lines, and are spaced apart from each other,
the second cutting portion of the CSL extending through a lowermost one of the plurality of gate lines and being spaced apart from the end portions of the plurality of gate lines,
the first cutting portions extending in a first direction and cutting through the plurality of gate lines,
the first cutting portions extending in a second direction,
the second cutting portion extending in a third direction crossing the second direction; and
a plurality of sub-cutting portions on the substrate wherein each of the sub-cutting portions being between the first cutting portions, each of the sub-cutting portions extending in the second direction, each of the sub-cutting portions cutting the plurality of gate lines, a material of each of the sub-cutting portions being a same as a material of the first cutting portions and the second cutting portion of the CSL, and
each of the sub-cutting portions being physically divided from the second cutting portion, or
each of the sub-cutting portions being connected to the second cutting portion and including a cut-off area,
wherein each of the sub-cutting portions each of the first cutting portions of the CSL are alternately disposed in the third direction.

14. The vertical, memory device of claim 13, further comprising:
a spacer surrounding sidewalls of the first cutting portions, the second cutting portion of the CSL, and the sub-cutting portions.

15. The vertical memory device of claim 13, wherein the first cutting portions of the CSL are electrically connected to the second cutting portion of the CSL.

16. The vertical memory device of claim 13, further comprising
contacts electrically connected to the end portions of the plurality of gate lines, wherein
the contacts extend vertical to the upper surface of the substrate.

17. The vertical memory device of claim 13, wherein
the lowermost one of the plurality of gate lines includes a dummy gate line, and
the second cutting portion of the CSL separates the dummy gate line from the end portions of the lowermost, one of the plurality of gate lines.

* * * * *